US010305027B2

(12) United States Patent
Kato et al.

(10) Patent No.: US 10,305,027 B2
(45) Date of Patent: May 28, 2019

(54) MAGNETORESISTIVE ELEMENT AND MAGNETIC MEMORY DEVICE

(71) Applicants: Kabushiki Kaisha Toshiba, Minato-ku (JP); NATIONAL INSTITUTE FOR MATERIALS SCIENCE, Tsukuba-shi (JP)

(72) Inventors: Yushi Kato, Chofu (JP); Tadaomi Daibou, Yokohama (JP); Yuuzo Kamiguchi, Yokohama (JP); Naoharu Shimomura, Meguro (JP); Junichi Ito, Yokohama (JP); Hiroaki Sukegawa, Tsukuba (JP); Mohamed Belmoubarik, Tsukuba (JP); Po-Han Cheng, Tsukuba (JP); Seiji Mitani, Tsukuba (JP); Tadakatsu Ohkubo, Tsukuba (JP); Kazuhiro Hono, Tsukuba (JP)

(73) Assignees: Kabushiki Kaisha Toshiba, Minato-ku (JP); NATIONAL INSTITUTE FOR MATERIALS SCIENCE, Tsukuba-shi (JP)

( * ) Notice: Subject to any disclaimer, the term of this patent is extended or adjusted under 35 U.S.C. 154(b) by 1 day.

(21) Appl. No.: 15/699,749

(22) Filed: Sep. 8, 2017

(65) Prior Publication Data

US 2018/0090671 A1    Mar. 29, 2018

(30) Foreign Application Priority Data

Sep. 28, 2016 (JP) .................. 2016-189475

(51) Int. Cl.
*H01L 27/22* (2006.01)
*H01L 43/02* (2006.01)
(Continued)

(52) U.S. Cl.
CPC ............ *H01L 43/08* (2013.01); *H01L 27/228* (2013.01); *H01L 43/10* (2013.01); *H01L 43/02* (2013.01)

(58) Field of Classification Search
CPC ...................................................... H01L 27/228
See application file for complete search history.

(56) References Cited

U.S. PATENT DOCUMENTS

2007/0139827 A1    6/2007    Gao et al.
2012/0061779 A1    3/2012    Ohmori et al.
(Continued)

FOREIGN PATENT DOCUMENTS

JP    2012-59957    3/2012
JP    2012-60087    3/2012
(Continued)

OTHER PUBLICATIONS

Atsuto Seko, et al., "Predication of ground-state structures and order-disorder phase transitions in II-III spinel oxides: A combined cluster-expansion mehtod and first principles study", Physical Review B, 73, 184117 (2006), 5 pages.

*Primary Examiner* — William A Harriston
(74) *Attorney, Agent, or Firm* — Oblon, McClelland, Maier & Neustadt, L.L.P.

(57) ABSTRACT

According to one embodiment, a magnetoresistive element includes a first magnetic layer, a second magnetic layer, and a first nonmagnetic layer. The first nonmagnetic layer is provided between the first magnetic layer and the second magnetic layer. The first nonmagnetic layer includes an oxide including an inverse-spinel structure.

18 Claims, 13 Drawing Sheets

(51) Int. Cl.
*H01L 43/08* (2006.01)
*H01L 43/10* (2006.01)

(56) References Cited

U.S. PATENT DOCUMENTS

| | | |
|---|---|---|
| 2012/0061781 A1* | 3/2012 | Ohmori ............... H01F 10/3286 257/421 |
| 2012/0120708 A1 | 5/2012 | Jin et al. |
| 2012/0128870 A1 | 5/2012 | Zhao et al. |
| 2013/0221461 A1 | 8/2013 | Sukegawa et al. |
| 2016/0380186 A1 | 12/2016 | Daibou et al. |

FOREIGN PATENT DOCUMENTS

| | | |
|---|---|---|
| JP | 2012-114442 A | 6/2012 |
| JP | 2013-102178 A | 5/2013 |
| JP | 2013-175615 | 9/2013 |
| JP | 2013-201458 A | 10/2013 |
| JP | 2014-107497 A | 6/2014 |
| JP | 2015-90870 | 5/2015 |
| JP | 2015-176930 A | 10/2015 |
| JP | 6103123 | 3/2017 |
| WO | WO 2016/158926 A1 | 10/2016 |
| WO | WO 2017/135251 A1 | 8/2017 |

* cited by examiner

Mg

Ga

O

M: MgGa$_2$O$_4$, F: Fe

MAGNETORESISTIVE ELEMENT AND MAGNETIC MEMORY DEVICE

CROSS-REFERENCE TO RELATED APPLICATIONS

This application is based upon and claims the benefit of priority from Japanese Patent Application No. 2016-189475, filed on Sep. 28, 2016; the entire contents of which are incorporated herein by reference.

FIELD

Embodiments described herein relate generally to magnetoresistive element and a magnetic memory device.

BACKGROUND

There is a magnetoresistive element that uses a MTJ (Magnetic Tunnel Junction) element. The MTJ element uses, for example, the tunneling magnetoresistive (TMR) effect. The magnetoresistive element is, for example, a memory cell of a magnetic memory device such as magnetic random access memory (MRAM), etc. It is desirable for the magnetoresistance ratio of the magnetoresistive element to be high.

DETAILED DESCRIPTION

Figures 1A, 1B:
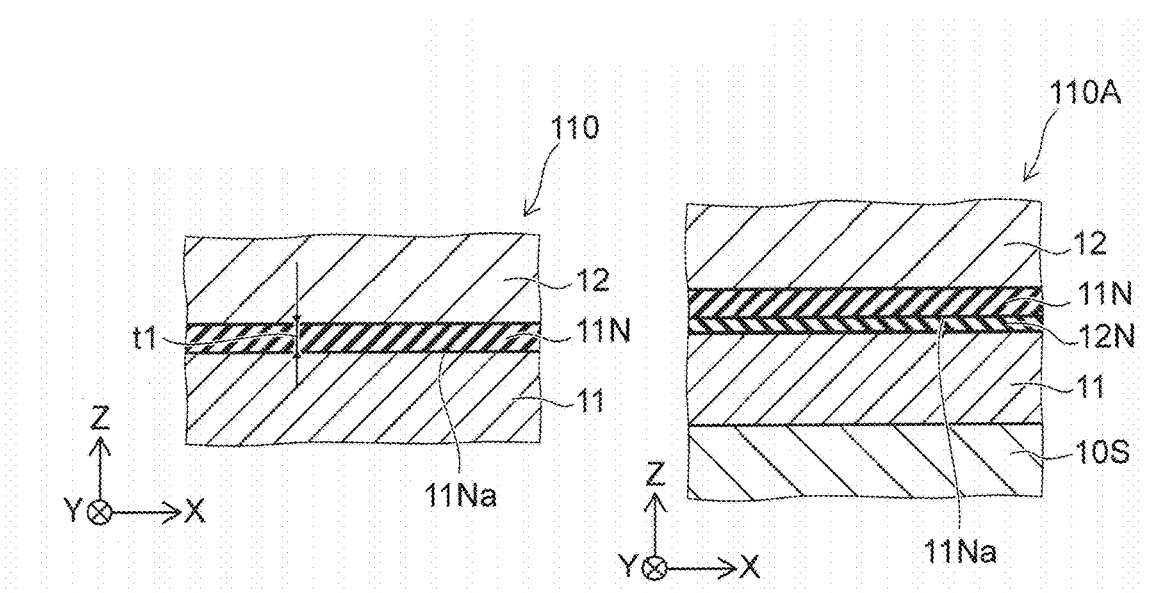
FIG. 1A and FIG. 1B are schematic cross-sectional views illustrating a magnetoresistive element according to a first embodiment.

According to one embodiment, a magnetoresistive element includes a first magnetic layer, a second magnetic layer, and a first nonmagnetic layer. The first nonmagnetic layer is provided between the first magnetic layer and the second magnetic layer. The first nonmagnetic layer includes an oxide including an inverse-spinel structure.

According to another embodiment, a magnetoresistive element includes a first magnetic layer, a second magnetic layer, and a first nonmagnetic layer. The first nonmagnetic layer is provided between the first magnetic layer and the second magnetic layer. The first nonmagnetic layer includes an oxide including Ga. The oxide has a plurality of photon energy peaks corresponding to a binding state of the Ga included in the oxide in X-ray absorption near edge structure analysis.

According to another embodiment, a magnetoresistive element includes a first magnetic layer, a second magnetic layer, and a first nonmagnetic layer. The first nonmagnetic layer is provided between the first magnetic layer and the second magnetic layer. The first nonmagnetic layer includes an oxide. The oxide includes Mg, Ga, and oxygen. The oxide has a first peak intensity of a first photon energy, a second peak intensity of a second photon energy, and an intermediate intensity of a third photon energy in a photon energy range not less than 10370 electron volts and not more than 10385 electron volts in X-ray absorption near edge structure analysis. The second photon energy is larger than the first photon energy. The third photon energy is between the first photon energy and the second photon energy. The intermediate intensity is lower than the first peak intensity and lower than the second peak intensity.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A and FIG. 1B are schematic cross-sectional views illustrating a magnetoresistive element according to a first embodiment.

As shown in FIG. 1A, the magnetoresistive element 110 according to the embodiment includes a first magnetic layer 11, a second magnetic layer 12, and a first nonmagnetic layer 11N. The first nonmagnetic layer 11N is provided between the first magnetic layer 11 and the second magnetic layer 12.

The first magnetic layer 11 is, for example, a ferromagnetic layer. The second magnetic layer 12 is, for example, a ferromagnetic layer. The first nonmagnetic layer 11N is, for example, a tunneling barrier layer. For example, the first nonmagnetic layer 11N includes an oxide.

In the example of a magnetoresistive element 110A according to the embodiment as shown in FIG. 1B, a base layer 10S and a second nonmagnetic layer 12N are provided in addition to the first magnetic layer 11, the second magnetic layer 12, and the first nonmagnetic layer 11N. The first magnetic layer 11 is provided between the base layer 10S and the second magnetic layer 12. The second nonmagnetic layer 12N is provided between the first magnetic layer 11 and the first nonmagnetic layer 11N. The second nonmagnetic layer 12N is, for example, a nonmagnetic metal layer. There are cases where the boundary between the second nonmagnetic layer 12N and the first nonmagnetic layer 11N is indistinct. In the case where the second nonmagnetic layer 12N is thin (e.g., 0.6 nm or less), the second nonmagnetic layer 12N and the first nonmagnetic layer 11N may be observed as one layer.

In the embodiment as described below, various layers other than the first magnetic layer 11, the second magnetic layer 12, and the first nonmagnetic layer 11N may be provided.

For example, the electrical resistance between the first magnetic layer 11 and the second magnetic layer 12 changes when energy (e.g., at least one of a magnetic field, an electric field, a current, a voltage, or stress) is applied to the magnetoresistive elements 110 and 110A.

For example, the change of the electrical resistance is based on the magnetoresistance effect. For example, the direction of at least one of the magnetization of the first magnetic layer 11 or the magnetization of the second magnetic layer 12 changes according to the applied energy. For example, the angle between these magnetizations changes according to the applied energy. Thereby, the electrical resistance between the first magnetic layer 11 and the second magnetic layer 12 changes.

For example, the first magnetic layer 11 functions as, for example, a free layer. The first magnetic layer 11 functions as, for example, a memory layer. The second magnetic layer 12 functions as, for example, a reference layer.

A first direction that connects the first magnetic layer 11 and the second magnetic layer 12 is taken as a Z-axis direction. One direction perpendicular to the Z-axis direction is taken as an X-axis direction. A direction perpendicular to the Z-axis direction and the X-axis direction is taken as a Y-axis direction. The first direction corresponds to the stacking direction of the first magnetic layer 11, the first nonmagnetic layer 11N, and the second magnetic layer 12.

The first nonmagnetic layer 11N has a face 11Na crossing the first direction (the Z-axis direction). The face 11Na is, for example, a face opposing the first magnetic layer 11. For example, the face 11Na is aligned with the {100} plane. In the embodiment, for example, the face 11Na may not be perfectly parallel to the {100} plane and may be, for example, tilted. The angle between the face 11Na and the {100} plane may be, for example, 10 degrees or less. The {100} plane may be, for example, the plane of the crystal orientation of the first magnetic layer 11.

The thickness of the first nonmagnetic layer 11N (a first nonmagnetic layer thickness t1 referring to FIG. 1A) is, for example, not less than 0.2 nm (nanometers) and not more than 4 nm. For example, an appropriate tunneling barrier effect is obtained using such a thickness. As described below, a high magnetoresistance ratio is obtained using such a thickness.

The first nonmagnetic layer thickness t1 is the length of the first nonmagnetic layer 11N along the first direction (the Z-axis direction). The first nonmagnetic layer thickness t1 may be, for example, not less than 1.1 nm and not more than 3.3 nm. The first nonmagnetic layer thickness t1 may be, for example, not less than 1.1 nm and not more than 3.0 nm. The first nonmagnetic layer thickness t1 may be, for example, not less than 1.1 nm and not more than 2.8 nm.

As described above, the first nonmagnetic layer 11N includes an oxide. The oxide includes, for example, Mg and Ga. The oxide may include $MgGa_2O_4$. Other examples of the oxide included in the first nonmagnetic layer 11N are described below.

In the embodiment, the oxide that is included in the first nonmagnetic layer 11N includes an inverse-spinel structure. It was found that a high magnetoresistance ratio MR is obtained thereby. For example, a high magnetoresistance ratio MR is obtained while maintaining a low resistance area product RA. The magnetoresistance ratio MR is, for example, the tunneling magnetoresistance ratio (the TMR ratio).

Examples of characteristics of the magnetoresistive element according to the embodiment will now be described. A sample (a first sample) of the experiment described below has the configuration of the magnetoresistive element 110A.

In the example, the base layer 10S is a Cr layer. The first magnetic layer 11 is an Fe layer. The second nonmagnetic layer 12N is a Mg layer. The thickness of the Mg layer is 0.6 nm. The first nonmagnetic layer 11N is a $MgGa_2O_4$ layer. The thickness of the $MgGa_2O_4$ layer (the first nonmagnetic layer thickness t1) is 3.0 nm. The second magnetic layer 12 is an Fe layer.

In the specification, the notation "first material name/ second material name" may be used. This notation means that a layer of the first material name is provided on a layer of the second material name. In the specification, the notation "first material name (first length)" may be used. This notation means that the thickness of a layer of the first material name is the first length. For example, the notation "Fe/$MgGa_2O_4$ (3.0 nm)" corresponds to the state in which an Fe layer is provided on a layer of $MgGa_2O_4$ having a thickness of 3.0 nm.

A structure of Fe/$MgGa_2O_4$ (3.0 nm)/Mg (0.6 nm)/Fe/Cr is provided in the first sample.

The preparation conditions of the first sample are as follows. A Cr layer is formed by sputtering at room temperature on a substrate (not illustrated); subsequently, heat treatment is performed at 800° C. An Fe layer is formed by sputtering at room temperature on the Cr layer; subsequently, heat treatment is performed at 400° C. A Mg layer is formed by sputtering at room temperature on the Fe layer; and a $MgGa_2O_4$ layer is formed by sputtering at room temperature on the Mg layer. Subsequently, heat treatment is performed at 500° C. An Fe layer is formed by sputtering at room temperature on the $MgGa_2O_4$ layer; subsequently, heat treatment is performed at 400° C. Thus, the first sample is made.

Figure 2:
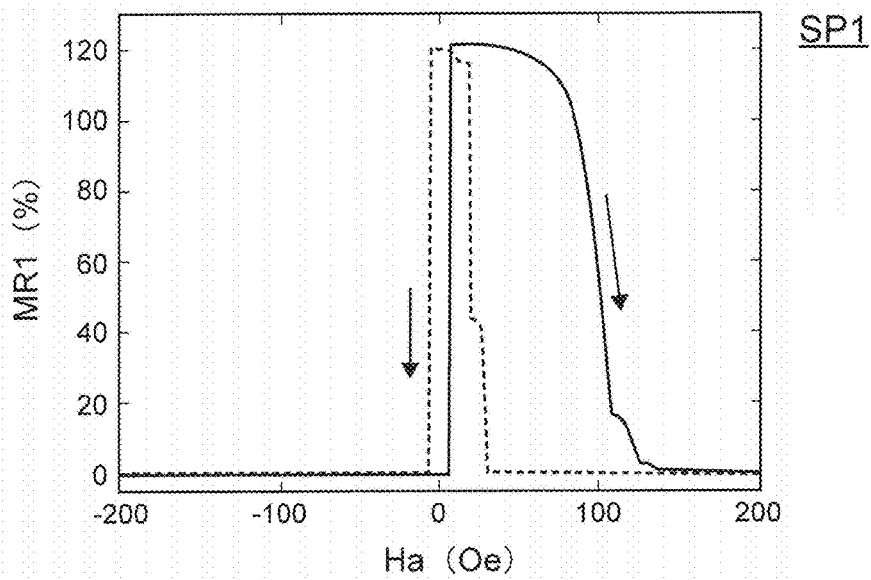
FIG. 2 is a graph illustrating a characteristic of the magnetoresistive element according to the embodiment.

FIG. 2 is a graph illustrating a characteristic of the magnetoresistive element according to the embodiment.

The horizontal axis of FIG. 2 is an external magnetic field Ha (oersteds (Oe)) applied from the outside to the first sample SP1 (the magnetoresistive element 110A) recited above. The vertical axis is a magnetoresistance ratio MR1 (%). The measurement temperature of the magnetoresistance ratio MR1 is 300 K (Kelvin).

In the first sample SP1 as shown in FIG. 2, the magnetoresistance ratio MR1 (at room temperature) is about 121% and is high. For example, this suggests that the coherent tunneling effect arises in the first sample SP1.

An example of structural analysis results of a sample will now be described. The sample of this structural analysis has the structure of the first sample SP1 in which the Mg layer is not provided. In other words, the sample of the structure analysis has the structure of the magnetoresistive element 110 illustrated in FIG. 1A. Otherwise, the sample of the structure analysis is similar to the first sample SP1.

FIG. 3A to FIG. 3E are photographs illustrating the analysis results of the magnetoresistive element.

Figure 3A:
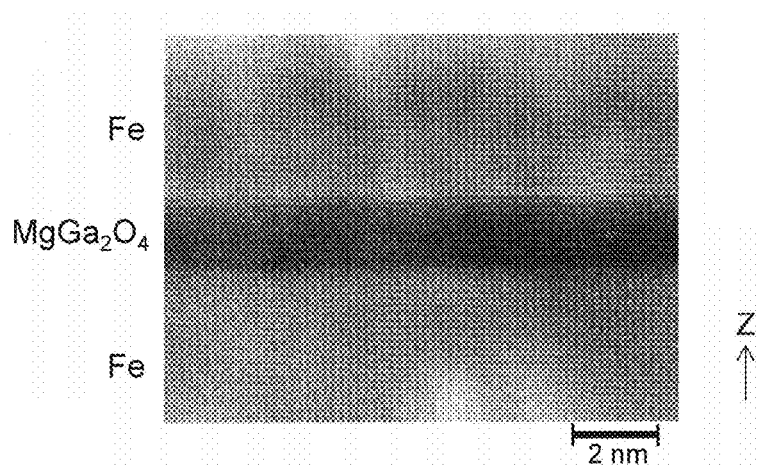
FIG. 3A to FIG. 3E are photographs illustrating the analysis results of the magnetoresistive element.
Figure 3B:
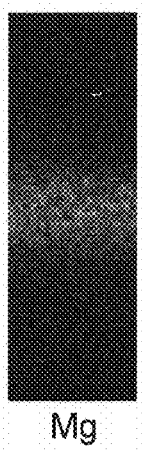
Figure 3C:
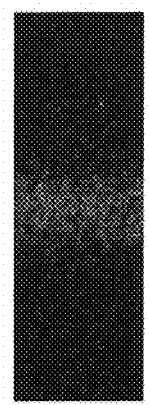
Figure 3D:
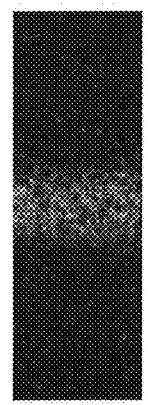
Figure 3E:
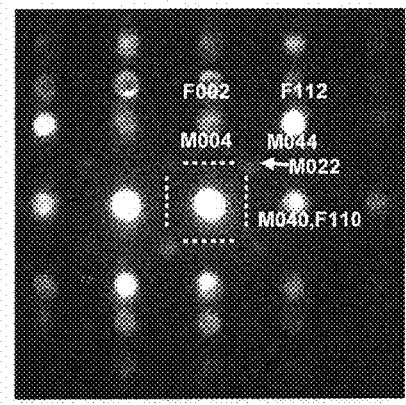

FIG. 3A is a cross sectional STEM (Scanning Transmission Electron Microscope) image of the sample. The image is observed along the Fe [110] plane. FIG. 3B to FIG. 3D show the analysis results of energy dispersive X-ray spectroscopy (EDS). FIG. 3B to FIG. 3D correspond respectively to the distributions of Mg, Ga, and O. FIG. 3E shows a nano electron diffraction image of the sample. The image is acquired from the region at the vicinity of the first nonmagnetic layer 11N (the $MgGa_2O_4$ layer) inside the sample. The numerals shown in FIG. 3E show the crystal planes of the diffraction spots.

It can be seen from FIG. 3A that the interface of the $MgGa_2O_4$ layer is exceedingly flat. It is considered that the stacked structure inside the sample is formed by epitaxial growth with the (001) orientation. The $MgGa_2O_4$ layer has, for example, a cubic inverse-spinel structure. The $MgGa_2O_4$ layer may be slightly tetragonally distorted. It is considered that this is due to the effect of the stress generated in the stacked structure including the $MgGa_2O_4$ layer. Dislocations substantially are not formed in the $MgGa_2O_4$ layer of the sample. A lattice-matched interface is obtained.

As shown in FIG. 3B to FIG. 3D, the $MgGa_2O_4$ layer is uniform. Segregation or elemental interdiffusion at the interfaces is not observed. It can be seen from the RBS analysis results that the $MgGa_2O_4$ layer has a substantially stoichiometric composition.

It can be seen from FIG. 3E that the stacked structure of the sample has the epitaxial relationship of Fe (001) [110]// $MgGa_2O_4$ (001) [100]. {022} spots of $MgGa_2O_4$ exist in FIG. 3E. Therefore, this suggests that the $MgGa_2O_4$ is ordered in a spinel structure. The spinel structure includes a normal spinel structure or an inverse-spinel structure.

As described below, the spinel structure includes an inverse-spinel structure in the sample recited above.

Figure 4A:
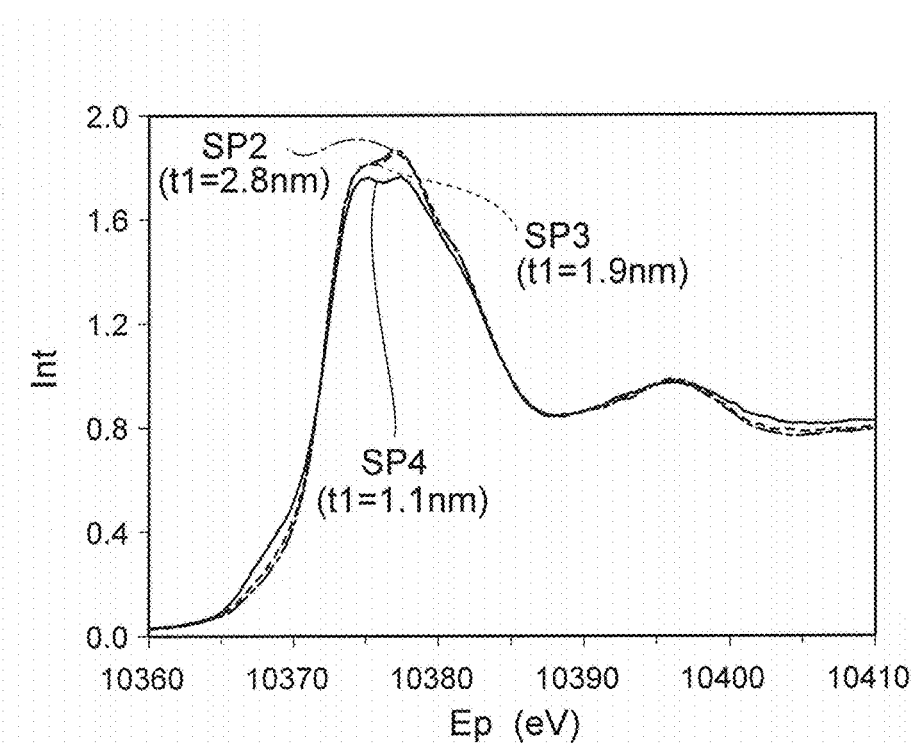
FIG. 4A and FIG. 4B are graphs illustrating analysis results of the magnetoresistive element.
Figure 4B:
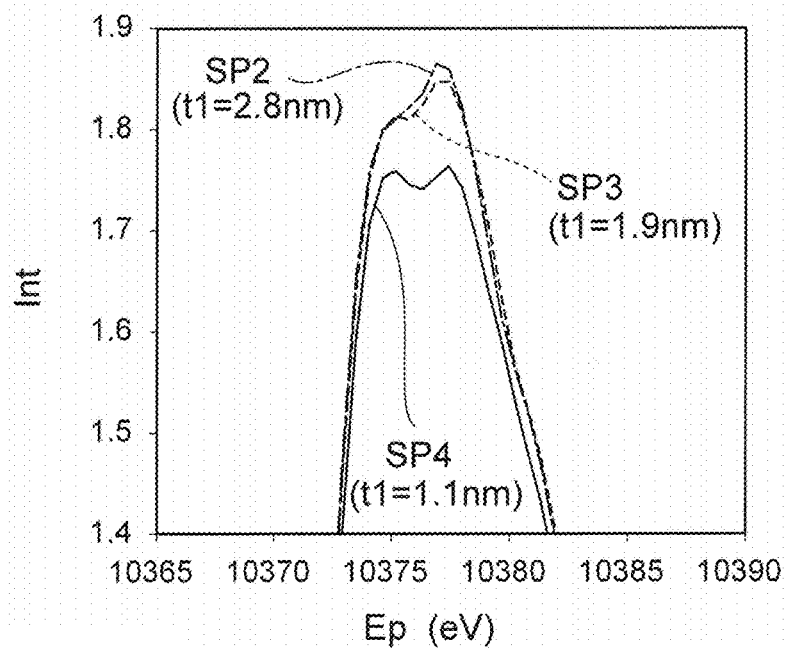

FIG. 4A and FIG. 4B are graphs illustrating analysis results of the magnetoresistive element.

These figures show examples of XANES (X-ray absorption near edge structure) analysis results of second to fourth samples SP2 to SP4. The second to fourth samples SP2 to SP4 have configurations similar to that of the first sample SP1 recited above (the structure of the magnetoresistive element 110A illustrated in FIG. 1B). The first nonmagnetic layer thickness t1 of the $MgGa_2O_4$ layer (the first nonmagnetic layer 11N) is different between the second to fourth samples SP2 to SP4. The first nonmagnetic layer thickness t1 is 2.8 nm, 1.9 nm, and 1.1 nm respectively in the second to fourth samples SP2 to SP4. The binding state of Ga is focused upon in the analysis results. FIG. 4B is an enlarged view of a portion of FIG. 4A. In these figures, the horizontal axis is a photon energy Ep (eV). The vertical axis is an intensity Int. The intensity Int is displayed as being normalized. In the second to fourth samples SP2 to SP4, heat treatment at 400 ° C. is performed after forming the Mg layer and the $MgGa_2O_4$ layer by sputtering at room temperature. Other than the different temperatures, the second to fourth samples SP2 to SP4 are made using conditions similar to those of the first sample SP1.

In FIG. 4A and FIG. 4B, peaks are obtained in a range of the photon energy Ep not less than 10370 eV (electron volts) and not more than 10385 eV. The peaks are related to the binding state of Ga. In the example, the peaks correspond to the peaks of the photon energy Ep corresponding to the electron energy of the Ga—K shell.

In the case where the first nonmagnetic layer thickness t1 is 1.1 nm, two peaks are observed distinctly in the range of the photon energy Ep. One of the two peaks (the peak on the low-energy side) corresponds to the peak when the Ga exists in a tetrahedral configuration (a first state). The other one of the two peaks (the peak on the high-energy-side) corresponds to the peak when the Ga exists in an octahedral configuration (a second state).

The two peaks are observed for the fourth sample SP4 in which the first nonmagnetic layer thickness t1 is 1.1 nm. It is estimated that the first state and the second state recited above exist in the fourth sample SP4. A valley is observed between the two peaks. The intensity Int at the valley is lower than the intensities Int at the two peaks. In the fourth sample SP4, the intensities Int of the two peaks are substantially the same.

In a perfect inverse-spinel structure, the amount (the density) of Ga at the tetrahedral sites and the amount (the density) of Ga at the octahedral sites are the same. Therefore, in the sample in which the first nonmagnetic layer thickness t1 is 1.1 nm, it is estimated that a substantially perfect inverse-spinel structure is provided.

Two peaks are observed also for the third sample SP3 in which the first nonmagnetic layer thickness t1 is 1.9 nm. In the third sample, the intensity Int of the peak on the low-energy side is lower than the intensity Int of the peak on the high-energy-side. In the third sample SP3, it is considered that the region of the first state is relatively small. In the third sample SP3, a valley is observed between the two peaks.

On the other hand, in the second sample SP2 in which the first nonmagnetic layer thickness t1 is 2.8 nm, the peak on the low-energy side has a shoulder-like shape.

The intensity Int of the peak on the low-energy side relatively increases as the first nonmagnetic layer thickness t1 decreases. This suggests an increase of the spinel inversion degree.

In the case where at least two peaks are observed, it is clear that the inverse-spinel structure exists. In the case where the peak on the low-energy side has a shoulder-like shape as well, the shoulder originates in the inverse-spinel structure. The inverse-spinel structure is included for the shoulder-like shape as well.

In the embodiment, for example, the oxide included in the first nonmagnetic layer 11N includes Ga; and the oxide has multiple photon energy peaks corresponding to the binding state of the Ga included in the oxide in X-ray absorption near edge structure analysis. For example, in the X-ray absorption near edge structure analysis, the oxide has multiple photon energy peaks corresponding to the electron energy of the Ga—K shell included in the oxide.

In the embodiment, for example, in the case where the oxide included in the first nonmagnetic layer 11N includes Mg, Ga, and oxygen, the oxide has two peak intensities and an intermediate intensity (a valley) between the two peaks in the range of the photon energy Ep of not less than 10370 eV and not more than 10385 eV in XANES analysis. One of the two peak intensities is a first peak intensity of a first photon energy (in the example, not less than 10373 eV and but than 17376 eV). The other one of the two peak intensities is a second peak intensity of a second photon energy (in the example, greater than 10376 eV and not more than 10385 eV). The second photon energy is larger than the first photon energy. The intermediate intensity is an intensity corresponding to a third photon energy. The third photon energy is between the first photon energy and the second photon energy. The intermediate intensity of the third photon energy is lower than the first peak intensity and lower than the second peak intensity. The first nonmagnetic layer 11N includes the inverse-spinel structure if at least such an intermediate intensity (valley) is observed.

The first nonmagnetic layer 11N (the $MgGa_2O_4$ layer) includes the inverse-spinel structure in the sample illustrated in FIG. 3A to FIG. 3E as well. The shoulder recited above is observed.

In the samples recited above, heat treatment is performed after the film deposition of each layer. The state of the crystal of the first nonmagnetic layer 11N changes according to the conditions of the heat treatment. For example, the state of the crystal changes according to the temperature, time, etc., of the heat treatment. The state of the crystal changes also according to the rising curve, the cooling curve, etc., of the temperature of the heat treatment. The oxide that includes the inverse-spinel structure is obtained by employing the appropriate preparation conditions.

For example, a thin oxide layer (the first nonmagnetic layer 11N) that is 4 nm or less is affected easily by the layers adjacent to the oxide layer. For example, the thin oxide layer is affected easily by the first magnetic layer 11 or the second magnetic layer 12. For example, the thin oxide layer is affected easily by the second nonmagnetic layer 12N or the base layer 10S used as the foundation. By employing appropriate preparation conditions, the inverse-spinel structure can be formed in the thin oxide layer as well.

It is considered that the structure (the proportion of normal spinel, inverse spinel, and amorphous) of the layer of $MgGa_2O_4$ changes according to the preparation conditions, the thickness, etc. The inverse-spinel structure is obtained by using the appropriate preparation conditions and thickness. For example, the state of the crystal also changes according to the temperature of the heat treatment, the time of the processing, the temperature change curve (rising and cooling), etc. For example, the crystallinity relates also to the oxygen concentration range in the oxygen charging during the heat treatment or after the heat treatment. For example, the crystallinity is affected by whether the heat treatment is performed after the formation of each of the multiple layers or whether the heat treatment is performed collectively after the formation of the multiple layers. The change of the crystallinity also includes, for example, a portion of $Ga^{3+}$ being reduced easily in the metal Ga. If the film deposition rate is high, the crystallinity and the flatness improve; and the inverse-spinel structure is obtained easily. For example, if the thickness is thin, the proportion of the inverse-spinel structure increases. When excessively thin, the film thickness is not more than the critical film thickness of crystallization; and the amorphous proportion increases. The thickness of the layer of $MgGa_2O_4$ (the first nonmagnetic layer 11N) is, for example, not less than 1.1 nm and not more than 3.3 nm.

Generally, a spinel-structure oxide is notated $(A_{1-x}B_x)$ $[A_xB_{2-x}]O_4$. In the notation, "x" is the spinel inversion degree. "A" and "B" are main group elements or elements of transition metals. "A" is, for example, an element that forms a divalent cation. "B" is an element that forms a trivalent cation. "O" is oxygen. In the notation, the elements inside the "( )"brackets are arranged to occupy ⅛ of the tetrahedral interstices of the cubic lattice formed of the oxygen ions. For example, the arrangement of the elements inside the "( )"brackets is ordered. In the notation, the elements inside the "[ ]" brackets are arranged to occupy ½ of the octahedral interstices. For example, the arrangement of the elements inside the "[ ]" brackets is ordered. The former and the latter each form spinel structures.

For example, x=0 in a normal spinel structure. The normal spinel structure is notated as $(A)[B_2]O_4$. On the other hand, in an inverse-spinel structure, x=1. The inverse-spinel structure is notated as $(B)[AB]O_4$.

Typical element metals that are included in the spinel structure include, for example, an element forming a divalent cation and an element forming a trivalent cation. The element that forms the divalent cation includes, for example, at least one selected from the group consisting of Zn and Mg. The element that forms the trivalent cation includes, for example, at least one selected from the group consisting of In, Ga, and Al.

The ease of oxygen entering the tetrahedral sites is, for example, (easy) Zn>In>Ga>Mg>Al (difficult). For example, In or Ga occupy the tetrahedral sites more easily than does Mg. For example, $MgGa_2O_4$ and $MgIn_2O_4$ include inverse-spinel structures as stable structures.

For example, there is a reference example in which rock-salt MgO is used as a tunneling barrier layer (e.g., the first nonmagnetic layer 11N). A high magnetoresistance ratio MR (e.g., about 300%) is obtained in the reference example. However, the bandgap of MgO is 7 eV to 8 eV and is high; therefore, the resistance area product is high. In a magnetic memory device that uses a magnetoresistive element, the resistance becomes high when the storage density is increased and the element size is reduced. Therefore, for the configuration of the reference example, the thickness of the MgO layer is set to be extremely thin when reducing the element size. However, for the thin MgO, the insulative properties degrade; and the manufacturing yield or the reliability decreases.

Conversely, in the oxide according to the embodiment as described below, a low resistance area product is obtained. It is considered that this is caused by the small bandgap of the oxide according to the embodiment. As described below, for example, the bandgap of $MgGa_2O_4$ is about 4.7 eV (not less than 4.7 eV and not more than 4.9 eV).

According to the embodiment, a high magnetoresistance ratio MR can be obtained while maintaining a low resistance area product.

It is considered that the high magnetoresistance ratio MR obtained for a rock-salt MgO case originates in the crystal structure of the rock-salt MgO. In rock-salt MgO, the Mg is arranged at all of the octahedral sites of oxygen.

On the other hand, in $MgGa_2O_4$ (i.e., $(Ga)[MgGa]O_4$), considering the two types of spinel structures, the inverse-spinel structure is closer to the structure of MgO than is the normal spinel structure. It is considered that the high magnetoresistance ratio MR obtained for $MgGa_2O_4$ having the inverse-spinel structure relates to the inverse-spinel structure being closer to the structure of MgO. Thus, it is considered that the high MR ratio obtained using the oxide ($MgGa_2O_4$, $MgIn_2O_4$, etc.) of the first nonmagnetic layer 11N is based on the inverse-spinel structure.

As described below, a low resistance area product RA is obtained for $MgGa_2O_4$ and the like.

On the other hand, $MgAl_2O_4$ has a normal spinel structure as a ground state. According to experiments of the inventors of the application, it was found that cation sites are ordered self-organizingly in $MgGa_2O_4$ similarly to MgO even by a room-temperature film deposition process. Therefore, the inverse-spinel structure is formed more easily in $MgGa_2O_4$ than in $MgAl_2O_4$.

Due to the property of being ordered self-organizingly, for example, a wider selection is possible for the layers (e.g., the first magnetic layer 11, etc.) other than the first nonmagnetic layer 11N. For example, the first nonmagnetic layer 11N may be a monocrystal or may be a polycrystal. In the case where the first nonmagnetic layer 11N includes a polycrystal, for example, an oriented film is included in the first nonmagnetic layer 11N.

In the embodiment, the oxide included in the first nonmagnetic layer 11N is, for example, $Mg_{1-x}Ga_xO_y$ (x being greater than 0 and less than 1, and y being not less than 3 and not more than 5). Or, the oxide included in the first nonmagnetic layer 11N is, for example, $Mg_{1-x}In_xO_y$ (x being greater than 0 and less than 1, and y being not less than 3 and not more than 5). For example, an inverse-spinel structure is obtained for such composition ranges. Other examples of the oxide are described below.

Examples of analysis methods of the crystalline state of the first nonmagnetic layer 11N of will now be described.

For example, information that relates to the crystalline state of the first nonmagnetic layer 11N is obtained by a structure analysis method using a TEM (Transmission Electron Microscope). For example, by TEM, information that relates to the crystal pattern, the existence of lattice defects, the direction of the crystal orientation, etc., is obtained. For example, information that relates to the organization structure and the crystal structure in an atomic scale can be obtained by also acquiring the electron diffraction pattern. For example, information that relates to whether or not the structure is an inverse-spinel structure is obtained by focusing on designated diffraction spots.

For example, the information that relates to the crystalline state of the first nonmagnetic layer 11N is obtained by HAADF-STEM (high-angle annular dark-field scanning transmission electron microscopy TEM). In this analysis method, electrons that are irradiated on the atoms and scattered are detected. Contrast that is proportional to an atomic number is obtained. Information that relates to the atomic arrangement is obtained by focusing on the contrast. The information that relates to whether or not the structure is an inverse-spinel structure is obtained.

For example, the information that relates to the crystalline state of the first nonmagnetic layer 11N is obtained by XAFS (X-ray absorption fine structure) analysis, EXAFS (Extended X-ray Absorption Fine Structure) analysis, XANES analysis, etc. In these analysis methods, structure analysis and analysis relating to the chemical states are possible. In these methods, non-destructive structure analysis or chemical state analysis in the depth direction is possible by selecting the analysis depth (surface or bulk). In XANES analysis, information that relates to the coordination structure of the elemental components is obtained. The information that relates to whether or not the structure is an inverse-spinel structure is obtained.

In a magnetic memory device that uses a magnetoresistive element, the resistance value increases when downscaling is performed. Therefore, it is desirable to reduce the resistance area product RA of the magnetoresistive element. There are reference examples in which MgO or $MgAl_2O_4$ is used as the barrier layer (e.g., the first nonmagnetic layer 11N). In these reference examples, the decrease of the resistance area product RA as a material is limited; and it is necessary to reduce the thickness of the barrier layer. In the case where the thickness of the barrier layer is reduced, the breakdown voltage of the barrier layer degrades abruptly. Therefore, the improvement of the magnetoresistance ratio MR ratio and the reduction of the resistance area product RA are desirable.

An example of the resistance area product RA of the magnetoresistive element according to the embodiment will now be described.

Figure 5:
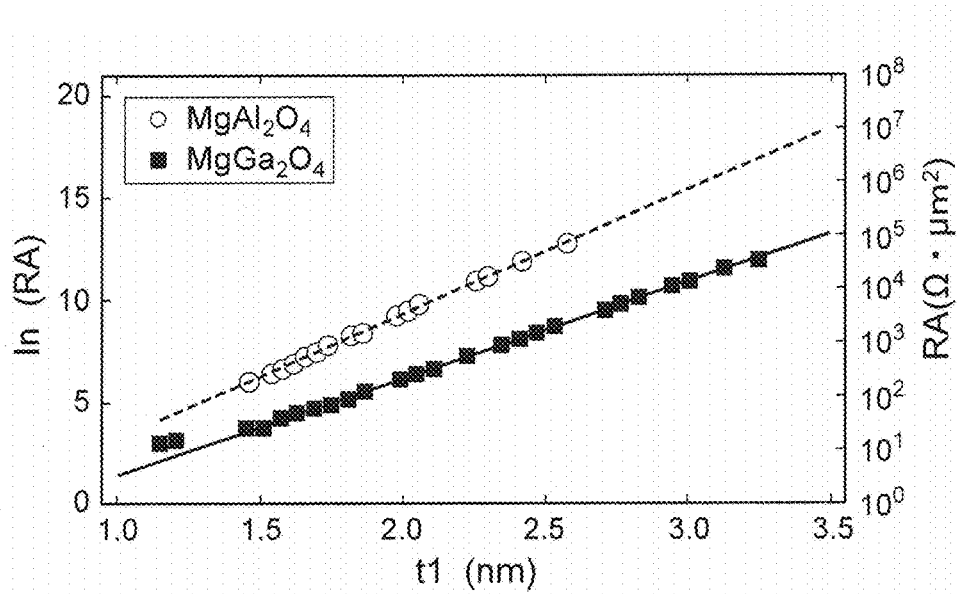
FIG. 5 is a graph illustrating characteristics of the magnetoresistive element.

FIG. 5 is a graph illustrating characteristics of the magnetoresistive element.

FIG. 5 shows an example of the resistance area product RA for samples (including, for example, the first to fourth samples SP1 to SP4, etc.) in which the first nonmagnetic layer 11N is $MgGa_2O_4$, and samples (the reference example) in which the first nonmagnetic layer 11N is $MgAl_2O_4$. In these samples, the first magnetic layer 11 and the second magnetic layer 12 both are Fe layers. The horizontal axis of FIG. 5 is the first nonmagnetic layer thickness t1 (nm). The vertical axis is the resistance area product RA ($\Omega \cdot \mu m^2$). The resistance area product RA corresponds to the state in which the magnetization of the first magnetic layer 11 and the magnetization of the second magnetic layer 12 are in a parallel state. The measurement temperature is 300 K. In the sample of $MgGa_2O_4$, the $MgGa_2O_4$ includes an inverse-spinel structure. In the sample of $MgAl_2O_4$ (the reference example), the $MgAl_2O_4$ includes a normal spinel structure.

As shown in FIG. 5, for the same first nonmagnetic layer thickness t1, the resistance area product RA of $MgGa_2O_4$ is lower than the resistance area product RA of $MgAl_2O_4$. Such a characteristic is confirmed at least for the case where the first nonmagnetic layer thickness t1 is not less than 1.1 nm and not more than 3.3 nm.

Thus, a low resistance area product RA is obtained using the $MgGa_2O_4$ (the first nonmagnetic layer 11N) according to the embodiment. According to the embodiment, a low resistance area product RA is obtained while obtaining a high magnetoresistance ratio MR. For example, the first nonmagnetic layer 11N is not excessively thin. Thereby, high reliability is obtained. According to the embodiment, a high magnetoresistance ratio MR is obtained. Further, a low resistance area product RA is obtained. High reliability is obtained For the two samples as shown in FIG. 5, the logarithm of the resistance area product RA increases linearly with the first nonmagnetic layer thickness t1. This suggests that the direct tunneling mode is dominant in these samples.

The change rate (the slope) of the increase of the resistance area product RA for the increase of the thickness in the sample of $MgGa_2O_4$ is lower than that of the sample of $MgAl_2O_4$. Therefore, this suggests that the barrier height of the sample of $MgGa_2O_4$ is lower than the barrier height of the sample of $MgAl_2O_4$.

Figure 6:
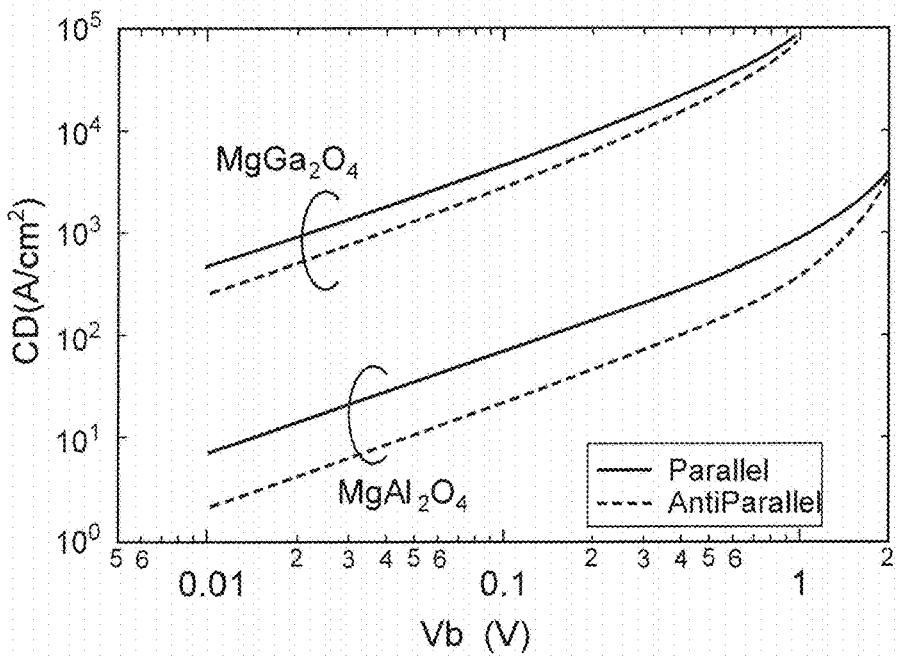
FIG. 6 is a graph illustrating a characteristic of the magnetoresistive element.

FIG. 6 is a graph illustrating a characteristic of the magnetoresistive element.

FIG. 6 shows examples of the current density of the two samples shown in FIG. 5. The horizontal axis of FIG. 6 is a bias voltage Vb (volts (V)). The vertical axis is a current density CD ($A/cm^2$). The measurement temperature is 300 K. In FIG. 6, the solid lines correspond to the state in which the magnetization of the first magnetic layer 11 and the magnetization of the second magnetic layer 12 are parallel. The dotted lines correspond to the state in which the magnetization of the first magnetic layer 11 and the magnetization of the second magnetic layer 12 are antiparallel.

In the sample of $MgGa_2O_4$ as shown in FIG. 6, the bias voltage Vb at which the current density CD changes abruptly is about 0.6 V. Conversely, in the sample of $MgAl_2O_4$, the bias voltage Vb at which the current density CD changes abruptly is about 1.1 V.

Generally, the bias voltage Vb at which the current density CD increases abruptly is related to the barrier height. From the results of FIG. 6, this suggests that the barrier height of $MgGa_2O_4$ is lower than the barrier height of $MgAl_2O_4$.

There is a correlation between the bandgap and the barrier height. The barrier height is reduced by reducing the bandgap. For example, by reducing the bandgap, for example, the resistance area product RA is reduced.

A high magnetoresistance ratio (MR ratio) is obtained for MgO or $MgAl_2O_4$. The bandgaps of these materials are 7 eV to 8 eV.

According to REELS (reflection electron energy loss spectroscopy) analysis results, the bandgap of $MgGa_2O_4$ is estimated to be about 4.7 eV. Thus, the bandgap of $MgGa_2O_4$ is smaller than the bandgap of MgO or $MgAl_2O_4$. For example, the barrier height of $MgGa_2O_4$ is lower than the barrier height of MgO or $MgAl_2O_4$. For the same first nonmagnetic layer thickness t1, the resistance area product RA of $MgGa_2O_4$ is lower than the resistance area product RA of MgO or $MgAl_2O_4$.

In the embodiment, it is favorable for the bandgap of the oxide included in the first nonmagnetic layer 11N to be, for example, less than 7 eV. It is more favorable for the bandgap of the oxide to be 5 eV or less.

On the other hand, when the bandgap is excessively small, for example, there are cases where it is difficult to maintain the tunneling transport mode and, for example, the MR ratio cannot be sufficiently high. In the embodiment, it is favorable for the bandgap of the oxide included in the first nonmagnetic layer 11N to be 2 eV or more; and it is more favorable to be 3 eV or more.

In the embodiment, it is favorable for the difference between the in-plane lattice constant of the first nonmagnetic layer 11N and the in-plane lattice constant of the first magnetic layer 11 to be small, and for the difference between the in-plane lattice constant of the first nonmagnetic layer 11N and the in-plane lattice constant of the second magnetic layer 12 to be small. For example, an interface that has substantially no dislocations is obtained. For example, the wave number selectivity of the tunneling electrons is not obstructed. For example, a high magnetoresistance ratio MR is obtained.

The magnetic layers that are included in the magnetoresistive element include, for example, a cubic material having a lattice constant that is about the same as that of Fe. Or, the magnetic layers include a tetragonal material having a lattice constant that is about the same as that of MnGa.

In the embodiment, for example, it is favorable for the oxide included in the first nonmagnetic layer 11N to include a material having good lattice matching with both Fe and MnGa. The a-axis lattice constant of Fe is 0.287 nm. The lattice constant is 0.405 nm when rotated 45 degrees in the plane. On the other hand, the a-axis lattice constant of MnGa is 0.389 nm.

For example, it is favorable for ½ of the lattice constant of the first nonmagnetic layer 11N to be not less than 0.3775 nm and not more than 0.4255 nm. The lower limit and the upper limit correspond respectively to 0.755 nm/2 and 0.851 nm/2. Thereby, the first nonmagnetic layer 11N matches the cubic magnetic layer of Fe and the like with a lattice constant difference within 5%.

Or, for example, it is favorable for ½ of the lattice constant of the first nonmagnetic layer 11N to be not less than 0.370 nm and not more than 0.409 nm. The lower limit and the upper limit correspond respectively to 0.740 nm/2 and 0.818 nm/2. Thereby, the first nonmagnetic layer 11N matches the tetragonal magnetic layer of MnGa and the like with a lattice constant difference within 5%.

For example, the lattice constants recited above correspond to the lattice constants in one direction in the X-Y plane.

In the magnetoresistive element 110A described in reference to FIG. 1B, for example, the oxidation state of the interface is well-controlled by the Mg layer (the second nonmagnetic layer 12N). In the embodiment, the second nonmagnetic layer 12N may be omitted.

In the magnetoresistive elements (e.g., the magnetoresistive element 110, etc.) according to the embodiment, the oxide included in the first nonmagnetic layer 11N is, for example, crystalline with the {100} plane and includes divalent cations and trivalent cations. The oxide has the inverse-spinel structure as a stable structure.

In the embodiment, for example, the electrical resistance of the magnetoresistive element changes due to energy supplied from the outside such as a write current, etc. For example, the change of the electrical resistance is based on the difference of the angles between the magnetization of the first magnetic layer 11 and the magnetization of the second magnetic layer 12. An example of the energy supplied from the outside is the write current. For example, the write current flows to the Z-axis direction.

For example, the direction of the magnetization of one of the first magnetic layer 11 or the second magnetic layer 12 substantially does not change before and after the supply of the write current to the magnetoresistive element. The direction of the other magnetization of the first magnetic layer 11 or the second magnetic layer 12 changes before and after the supply of the write current. For example, the former corresponds to the reference layer. The latter corresponds to a memory layer (or a free layer).

For example, an example of the change of the magnetization in the case where the first magnetic layer 11 is a memory layer and the second magnetic layer 12 is a reference layer will now be described.

For example, the write current is supplied in the direction from the first magnetic layer 11 toward the second magnetic layer 12 in the case where the magnetization of the first magnetic layer 11 and the magnetization of the second magnetic layer 12 are antiparallel to each other. Electrons pass through the first nonmagnetic layer 11N from the second magnetic layer 12 and flow in the first magnetic layer 11. The electrons are spin-polarized by passing through the second magnetic layer 12. The spin-polarized electrons flow in the first magnetic layer 11. The spin-polarized electrons that have the spin in the same direction as the magnetization of the first magnetic layer 11 pass through the first magnetic layer 11. On the other hand, the spin-polarized electrons that have the spin in the opposite direction of the magnetization of the first magnetic layer 11 apply spin-torque to the magnetization of the first magnetic layer 11. The direction of the magnetization of the first magnetic layer 11 changes to the same orientation as the magnetization of the second magnetic layer 12. The direction of the magnetization of the first magnetic layer 11 reverses. The magnetization of the first magnetic layer 11 becomes parallel to (the same direction as) the direction of the magnetization of the second magnetic layer 12.

On the other hand, in the case where the direction of the magnetization of the first magnetic layer 11 and the direction of the magnetization of the second magnetic layer 12 are parallel to each other, the write current is supplied from the second magnetic layer 12 toward the first magnetic layer 11. The electrons pass through the first nonmagnetic layer 11N from the first magnetic layer 11 and flow in the second magnetic layer 12. The electrons are spin-polarized by passing through the first magnetic layer 11. The spin-polarized electrons flow in the second magnetic layer 12. The spin-polarized electrons that have the spin in the same direction as the magnetization of the second magnetic layer 12 pass through the second magnetic layer 12. On the other hand, the spin-polarized electrons that have the spin of the opposite orientation of the magnetization of the second magnetic layer 12 are reflected by the interface between the first nonmagnetic layer 11N and the second magnetic layer 12, pass through the first nonmagnetic layer 11N, and flow into the second magnetic layer 12. These electrons apply spin-torque to the magnetization of the first magnetic layer 11 and act to cause the direction of the magnetization of the first magnetic layer 11 to be oriented in the opposite direction of the magnetization of the second magnetic layer 12. The direction of the magnetization of the first magnetic layer 11 reverses. The magnetization of the first magnetic layer 11 becomes antiparallel to the direction of the magnetization of the second magnetic layer 12.

In the embodiment, the first magnetic layer 11 and the second magnetic layer 12 are mutually interchangeable. For example, the first magnetic layer 11 may be the reference layer; and the second magnetic layer 12 may be the memory layer.

In the embodiment, it is favorable for at least one of the coercivity, an anisotropic magnetic field Hk, or a Gilbert damping constant α to be different between the first magnetic layer 11 and the second magnetic layer 12; and, for example, the angle of the magnetization direction can be controlled more stably.

For example, the magnetic layer in which one of the coercivity, the anisotropic magnetic field Hk, or the Gilbert damping constant α is relatively large corresponds to the reference layer. The magnetic layer in which one of the coercivity, the anisotropic magnetic field Hk, or the Gilbert damping constant α is relatively small corresponds to the memory layer.

Several examples of another magnetoresistive element according to the embodiment will now be described. The magnetoresistive element recited below also includes the first magnetic layer 11, the second magnetic layer 12, and the first nonmagnetic layer 11N. The base layer 10S (e.g., a metal layer of Cr, etc.) may be further provided. The magnetoresistive element is similar to the magnetoresistive element 110 or 110A; and a description is therefore omitted. The second nonmagnetic layer 12N may be provided in the several examples of the magnetoresistive element described below.

In the following description, the notation "first element name (second element name)" means the state in which the element of the second element name is included in the material of the first element name or the state in which the second element substantially is not included. For example, the notation "CoFe(B)" corresponds to the state in which CoFe is included or the state in which CoFeB is included.

Figure 7:
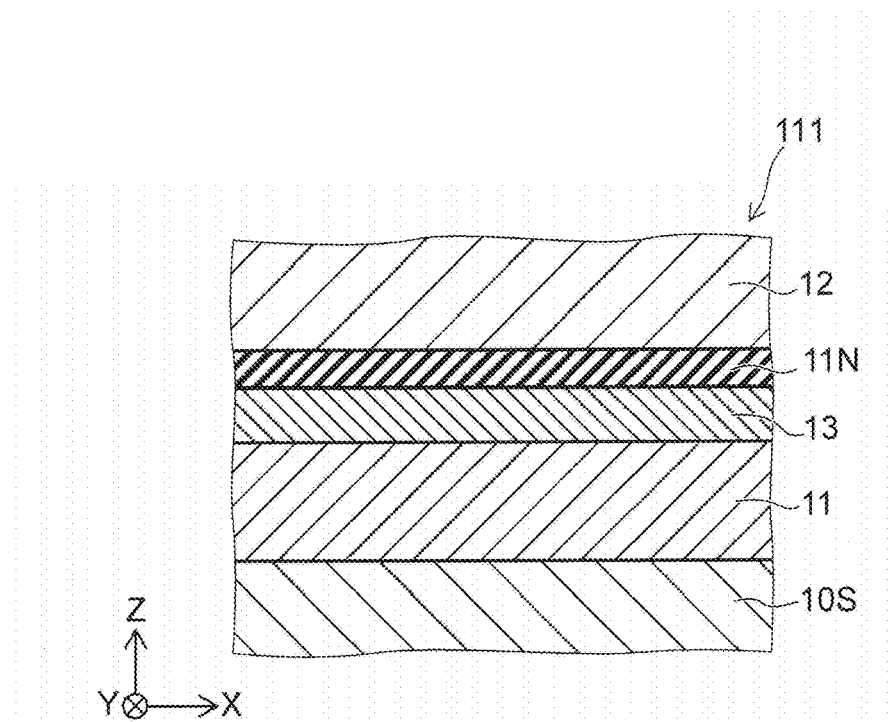
FIG. 7 is a schematic cross-sectional view showing the other magnetoresistive element according to the first embodiment.

In the following description, the notation "material name (plane orientation)" means that one surface (a film surface) of a layer of the material name is aligned with the plane orientation. For example, the notation "MnGa (001)" corresponds to the state in which a layer of MnGa is stacked with another layer, and one surface of the MnGa is aligned with the (001) plane. The one surface crosses a direction (the stacking direction) connecting the layer of MnGa and the other layer. The one surface is, for example, a surface aligned with the X-Y plane. FIG. 7 is a schematic cross-sectional view showing the other magnetoresistive element according to the first embodiment.

As shown in FIG. 7, a third magnetic layer 13 is provided in the other magnetoresistive element 111 according to the embodiment. The third magnetic layer 13 is provided between the first magnetic layer 11 and the first nonmagnetic layer 11N.

For example, the state in which the first magnetic layer 11 and the third magnetic layer 13 are magnetically coupled to each other is favorable. For example, the magnetization of the first magnetic layer 11 reverses as one body with the third magnetic layer 13. For example, the magnetization of the third magnetic layer 13 reverses as one body with the first magnetic layer 11. The orientation of the magnetization of the first magnetic layer 11 is substantially the same as the orientation of the magnetization of the third magnetic layer 13.

For example, the spin polarization can be large by using the third magnetic layer 13. Thereby, the magnetoresistance ratio MR can be increased further.

In a first example of the magnetoresistive element 111, the first magnetic layer 11 includes MnGa. The third magnetic layer 13 includes CoFe(B). The first nonmagnetic layer 11N includes crystalline $MgGa_2O_4$. The second magnetic layer 12 includes MnGe. For example, the orientation relationship of MnGe (001)/$MgGa_2O_4$ (001)/CoFe(B) (001)/MnGa (001) is obtained.

In a second example of the magnetoresistive element 111, the first magnetic layer 11 includes MnGa. The third magnetic layer 13 includes $Co_2FeAl$. The first nonmagnetic layer 11N includes crystalline $MgGa_2O_4$. The second magnetic layer 12 includes MnGe. For example, the orientation relationship of MnGe (001)/$MgGa_2O_4$ (001)/$Co_2FeAl$ (001)/MnGa (001) is obtained.

In a third example of the magnetoresistive element 111, the first magnetic layer 11 includes MnGa. The third magnetic layer 13 includes $Fe_3O_4$. The first nonmagnetic layer 11N includes crystalline $MgGa_2O_4$. The second magnetic layer 12 includes MnGe. For example, the orientation relationship of MnGe (001)/$MgGa_2O_4$ (001)/$Fe_3O_4$ (001)/MnGa (001) is obtained.

Figure 8:
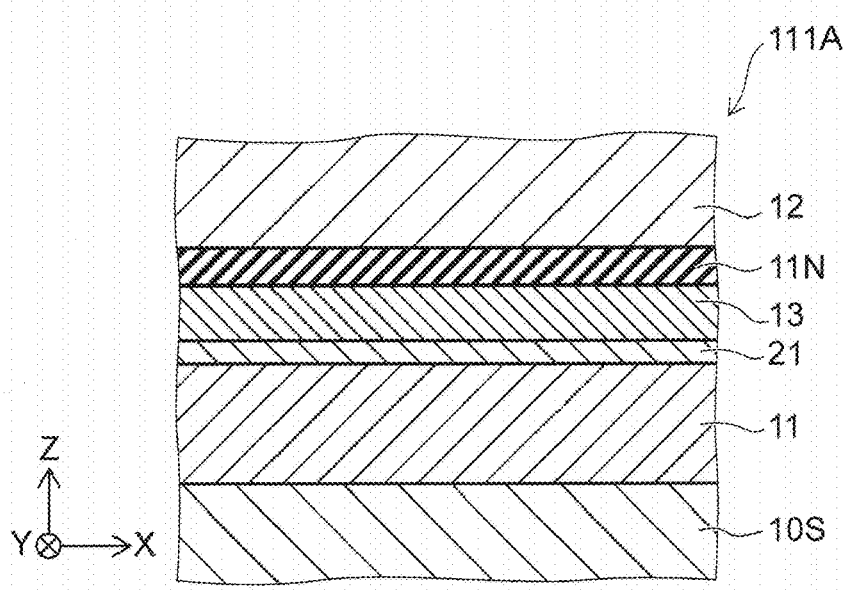
FIG. 8 is a schematic cross-sectional view showing another magnetoresistive element according to the first embodiment.

FIG. 8 is a schematic cross-sectional view showing another magnetoresistive element according to the first embodiment.

As shown in FIG. 8, the magnetoresistive element 111A according to the embodiment includes the third magnetic layer 13 and a first intermediate layer 21. The third magnetic layer 13 is provided between the first magnetic layer 11 and the first nonmagnetic layer 11N. The first intermediate layer 21 is provided between the first magnetic layer 11 and the third magnetic layer 13.

For example, the spin polarization is increased by the third magnetic layer 13. For example, the crystal structure between the first magnetic layer 11 and the third magnetic layer 13 is adjusted by the first intermediate layer 21. For example, the diffusion of the elements is suppressed by the first intermediate layer 21.

In a first example of the magnetoresistive element 111A, the first magnetic layer 11 includes MnGa. The first intermediate layer 21 includes an amorphous layer. The third magnetic layer 13 includes, for example, CoFe(B). The first nonmagnetic layer 11N includes crystalline $MgGa_2O_4$. The second magnetic layer 12 includes MnGe. For example, the orientation relationship of MnGe (001)/$MgGa_2O_4$ (001)/CoFe(B) (001)/amorphous layer/MnGa (001) is provided.

For example, at least a portion of the third magnetic layer 13 becomes amorphous during the film deposition due to the amorphous first intermediate layer 21. For example, the orientation of the first nonmagnetic layer 11N improves. The amorphous layer of the first intermediate layer 21 includes, for example, at least one element selected from the group consisting of Mg, Ba, Ca, Sr, Sc, Y, Ta, W, Nb, Gd, Tb, Dy, Ce, Ho, Yb, Er, B, C, and N.

In a second example of the magnetoresistive element 111A, the first magnetic layer 11 includes MnGa. The first intermediate layer 21 includes a crystalline layer. The third magnetic layer 13 includes $Co_2FeAl$. The first nonmagnetic layer 11N includes crystalline $MgGa_2O_4$. The second magnetic layer 12 includes MnGe. For example, the orientation relationship of MnGe (001)/$MgGa_2O_4$ (001)/$Co_2FeAl$ (001)/crystalline layer/MnGa (001) is provided.

Figure 9:
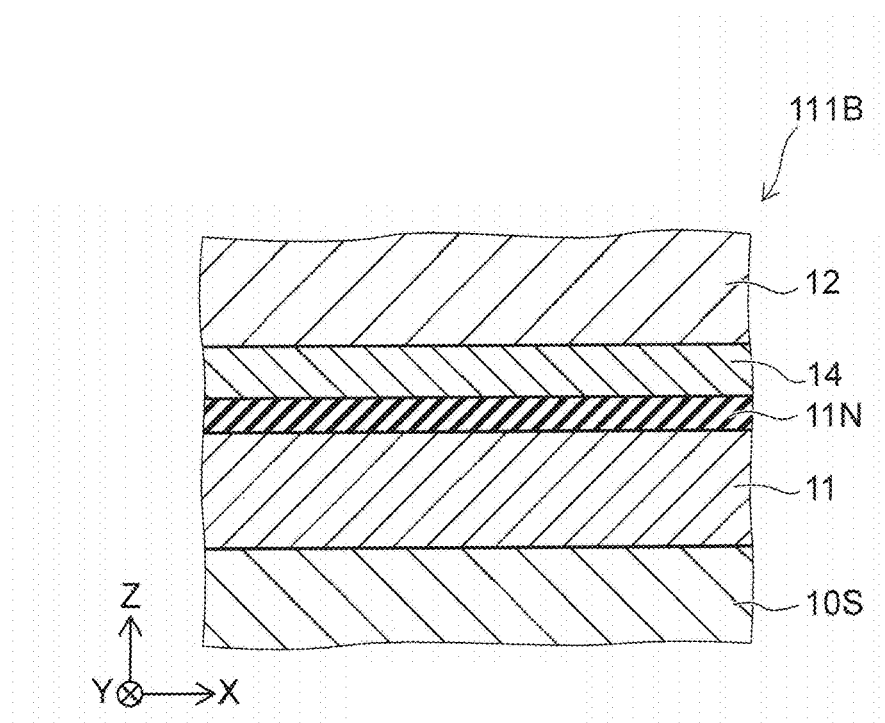
FIG. 9 is a schematic cross-sectional view showing another magnetoresistive element according to the first embodiment.

FIG. 9 is a schematic cross-sectional view showing another magnetoresistive element according to the first embodiment.

As shown in FIG. 9, the magnetoresistive element 111B according to the embodiment includes a fourth magnetic layer 14. The fourth magnetic layer 14 is provided between the second magnetic layer 12 and the first nonmagnetic layer 11N.

The fourth magnetic layer 14 is magnetically coupled to, for example, the second magnetic layer 12. For example, the spin polarization is increased by providing the fourth magnetic layer 14.

In a first example of the magnetoresistive element 111B, for example, the first magnetic layer 11 includes CoFe(B). The first nonmagnetic layer 11N includes crystalline $MgGa_2O_4$. The fourth magnetic layer 14 includes CoFe(B). The second magnetic layer 12 includes MnGe. For example, the orientation relationship of MnGe (001)/CoFe(B) (001)/$MgGa_2O_4$ (001)/CoFe(B) (001) is provided.

In a second example of the magnetoresistive element 111B, the first magnetic layer 11 includes $Co_2FeAl$. The first nonmagnetic layer 11N includes crystalline $MgGa_2O_4$. The fourth magnetic layer 14 includes $Co_2FeAl$. The second magnetic layer 12 includes MnGe. For example, the orientation relationship of MnGe (001)/$Co_2FeAl$ (001)/$MgGa_2O_4$ (001)/$Co_2FeAl$ (001) is provided.

Figure 10:
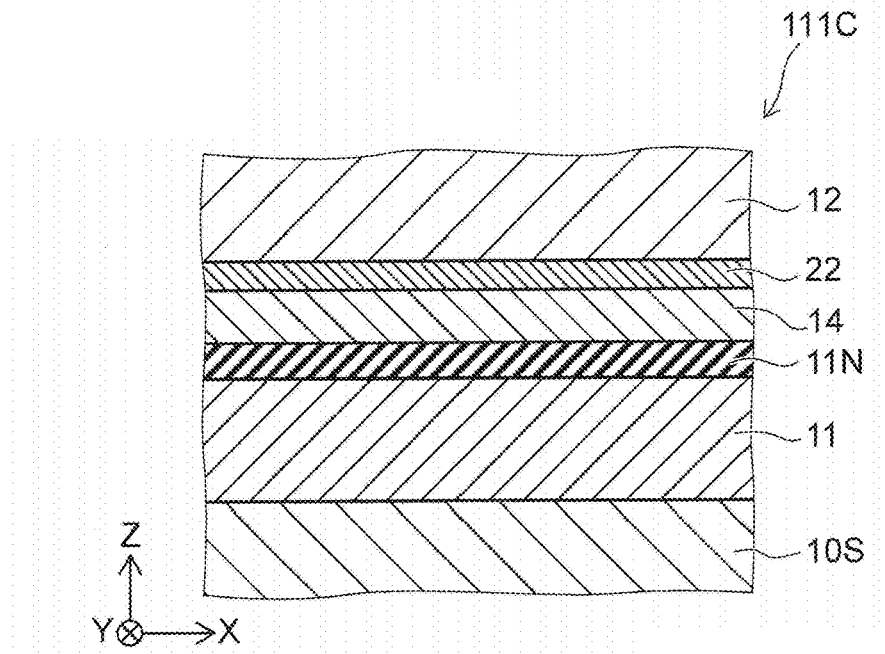
FIG. 10 is a schematic cross-sectional view showing another magnetoresistive element according to the first embodiment.

FIG. 10 is a schematic cross-sectional view showing another magnetoresistive element according to the first embodiment.

As shown in FIG. 10, the magnetoresistive element 111C according to the embodiment includes the fourth magnetic layer 14 and a second intermediate layer 22. The fourth magnetic layer 14 is provided between the second magnetic layer 12 and the first nonmagnetic layer 11N. The second intermediate layer 22 is provided between the fourth magnetic layer 14 and the second magnetic layer 12.

The fourth magnetic layer 14 is magnetically coupled to, for example, the second magnetic layer 12. For example, the spin polarization is increased by providing the fourth magnetic layer 14.

For example, the crystal structure between the second magnetic layer 12 and the fourth magnetic layer 14 is adjusted by the second intermediate layer 22. For example, the diffusion of the elements is suppressed by the second intermediate layer 22.

In a first example of the magnetoresistive element 111C, the first magnetic layer 11 includes CoFe(B). The first nonmagnetic layer 11N includes crystalline $MgGa_2O_4$. The fourth magnetic layer 14 includes CoFe(B). The second intermediate layer 22 includes an amorphous layer. The second magnetic layer 12 includes CoPt. For example, the orientation relationship of CoPt (111)/amorphous layer/CoFe(B) (001)/$MgGa_2O_4$ (001)/CoFe(B) (001) is provided. By using the amorphous layer, the difference of the crystal types between the second magnetic layer 12 and the fourth magnetic layer 14 is reset. The amorphous layer that is used to form the second intermediate layer 22 includes, for example, at least one element selected from the group consisting of Ta, W, Mo, Nb, Ru, Rh, and Ir.

In a second example of the magnetoresistive element 111C, the first magnetic layer 11 includes $Co_2FeAl$. The first nonmagnetic layer 11N includes crystalline $MgGa_2O_4$. The fourth magnetic layer 14 includes $Co_2FeAl$. The second intermediate layer 22 includes a crystalline layer. The second magnetic layer 12 includes MnGe. For example, the orientation relationship of MnGe (001)/crystalline layer/$Co_2FeAl$ (001)/$MgGa_2O_4$ (001)/$Co_2FeAl$ (001) is provided.

Figure 11:
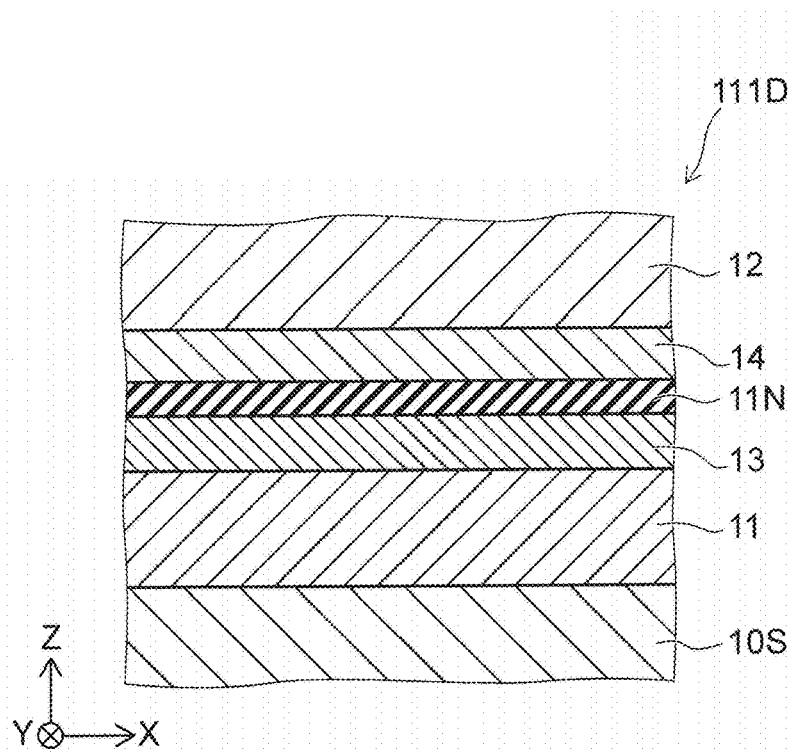
FIG. 11 is a schematic cross-sectional view showing another magnetoresistive element according to the first embodiment.

FIG. 11 is a schematic cross-sectional view showing another magnetoresistive element according to the first embodiment.

As shown in FIG. 11, the magnetoresistive element 111D according to the embodiment includes the third magnetic layer 13 and the fourth magnetic layer 14.

In a first example of the magnetoresistive element 111D, the first magnetic layer 11 includes MnGa. The third magnetic layer 13 includes CoFe(B). The first nonmagnetic layer 11N includes crystalline $MgGa_2O_4$. The fourth magnetic layer 14 includes CoFe(B). The second magnetic layer 12 includes MnGe. For example, the orientation relationship of MnGe (001)/CoFe(B) (001)/$MgGa_2O_4$ (001)/CoFe(B) (001)/MnGa (001) is provided.

In a second example of the magnetoresistive element 111D, the first magnetic layer 11 includes MnGa. The third magnetic layer 13 includes $Co_2FeAl$. The first nonmagnetic layer 11N includes crystalline $MgGa_2O_4$. The fourth magnetic layer 14 includes $Co_2FeAl$. The second magnetic layer 12 includes MnGe. For example, the orientation relationship of MnGe (001)/$Co_2FeAl$ (001)/$MgGa_2O_4$ (001)/$Co_2FeAl$ (001)/MnGa (001) is provided.

Figure 12:
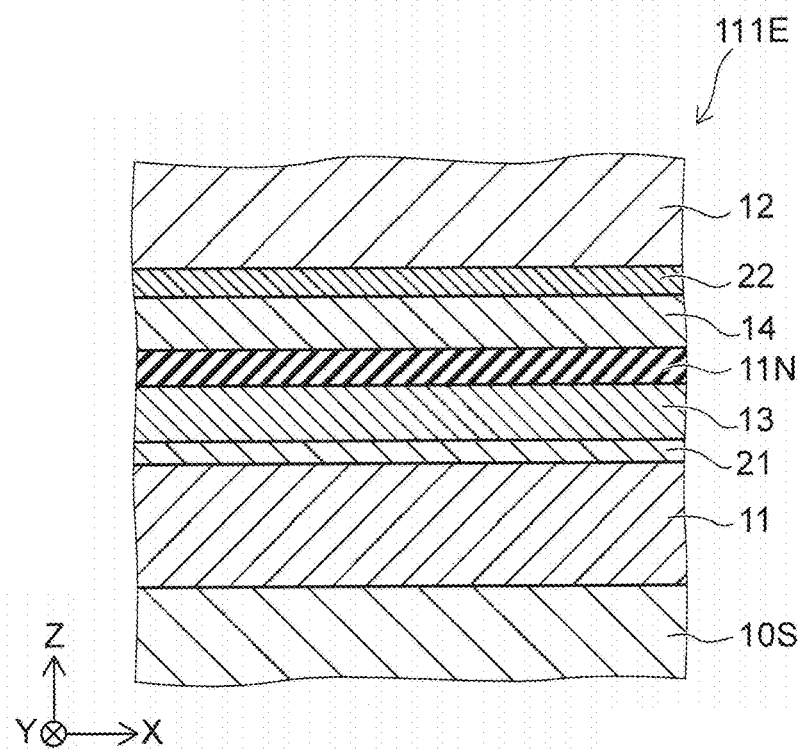
FIG. 12 is a schematic cross-sectional view showing another magnetoresistive element according to the first embodiment.

FIG. 12 is a schematic cross-sectional view showing another magnetoresistive element according to the first embodiment.

As shown in FIG. 12, the magnetoresistive element 111E according to the embodiment includes the first intermediate layer 21, the third magnetic layer 13, the fourth magnetic layer 14, and the second intermediate layer 22.

In a first example of the magnetoresistive element 111E, the first magnetic layer 11 includes MnGa. The first intermediate layer 21 includes an amorphous layer. The third magnetic layer 13 includes CoFe(B). The first nonmagnetic layer 11N includes crystalline $MgGa_2O_4$. The fourth magnetic layer 14 includes CoFe(B). The second intermediate layer 22 includes an amorphous layer. The second magnetic layer 12 includes CoPt. For example, the orientation relationship of CoPt (111)/amorphous layer/CoFe(B) (001)/$MgGa_2O_4$ (001)/CoFe(B) (001)/amorphous layer/MnGa (001) is provided. In a second example of the magnetoresistive element 111E, the first magnetic layer 11 includes MnGa. The first intermediate layer 21 includes a crystalline layer. The third magnetic layer 13 includes $Co_2FeAl$. The first nonmagnetic layer 11N includes crystalline $MgGa_2O_4$. The fourth magnetic layer 14 includes $Co_2FeAl$. The second intermediate layer 22 includes a crystalline layer. The second magnetic layer 12 includes MnGe. For example, the orientation relationship of MnGe (001)/crystalline layer/$Co_2FeAl$ (001)/$MgGa_2O_4$ (001)/$Co_2FeAl$ (001)/crystalline layer/MnGa (001) is provided.

In a third example of the magnetoresistive element 111E, the first magnetic layer 11 includes MnGa. The first intermediate layer 21 includes a crystalline layer. The third magnetic layer 13 includes $Fe_3O_4$. The first nonmagnetic layer 11N includes crystalline $MgGa_2O_4$. The fourth magnetic layer includes $Co_2FeAl$. The second intermediate layer 22 includes a crystalline layer. The second magnetic layer 12 includes MnGe. For example, the orientation relationship of MnGe (001)/crystalline layer/$Co_2FeAl$ (001)/$MgGa_2O_4$ (001)/$Fe_3O_4$ (001)/crystalline layer/MnGa (001) is provided.

Figure 13:
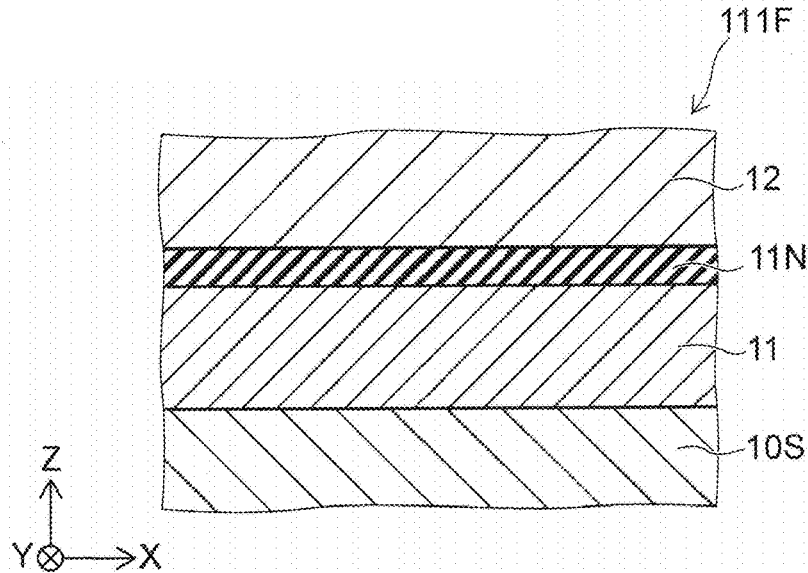
FIG. 13 is a schematic cross-sectional view showing another magnetoresistive element according to the first embodiment.

FIG. 13 is a schematic cross-sectional view showing another magnetoresistive element according to the first embodiment.

As shown in FIG. 13, the magnetoresistive element 111F according to the embodiment includes the first magnetic layer 11, the first nonmagnetic layer 11N, and the second magnetic layer 12.

In a first example of the magnetoresistive element 111F, the first magnetic layer 11 includes CoFe(B). The first nonmagnetic layer 11N includes crystalline $MgGa_2O_4$. The second magnetic layer 12 includes CoFe(B). The orientation relationship of CoFe(B) (001)/$MgGa_2O_4$ (001)/CoFe(B) is provided.

In a second example of the magnetoresistive element 111F, the first magnetic layer 11 includes MnGa. The first nonmagnetic layer 11N includes crystalline $MgGa_2O_4$. The second magnetic layer 12 includes MnGe. For example, the orientation relationship of MnGe (001)/$MgGa_2O_4$ (001)/MnGa (001) is provided.

Figure 14:
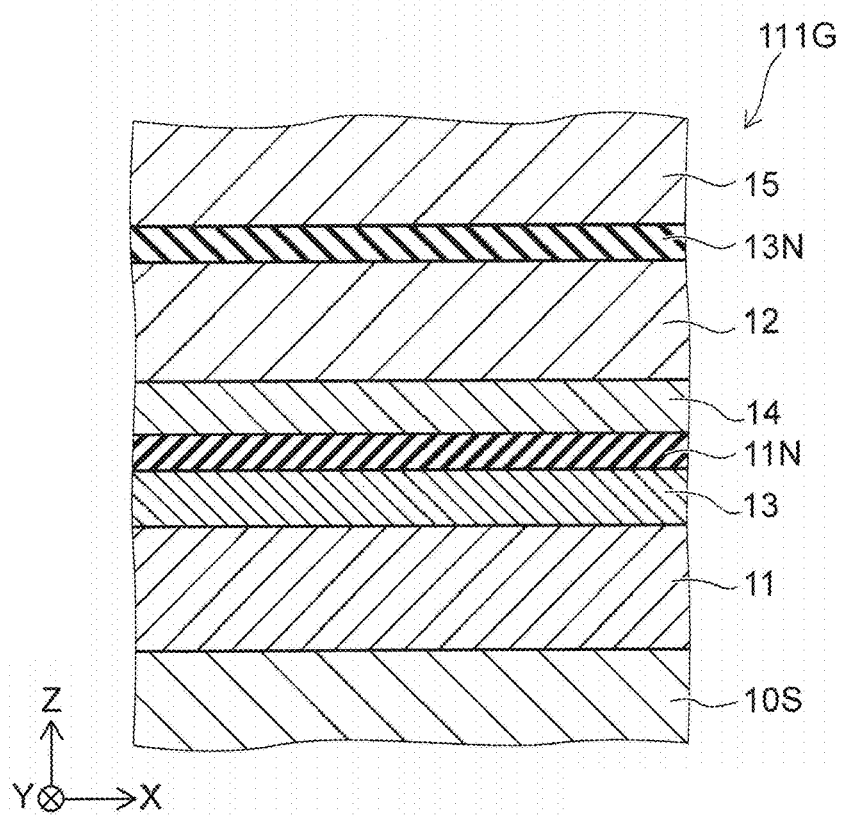
FIG. 14 is a schematic cross-sectional view showing another magnetoresistive element according to the first embodiment.

FIG. 14 is a schematic cross-sectional view showing another magnetoresistive element according to the first embodiment.

As shown in FIG. 14, the magnetoresistive element 111G according to the embodiment includes the third magnetic layer 13, the fourth magnetic layer 14, a third nonmagnetic layer 13N, and a fifth magnetic layer 15.

The second magnetic layer 12 is provided between the first magnetic layer 11 and the fifth magnetic layer 15. The third nonmagnetic layer 13N is provided between the second magnetic layer 12 and the fifth magnetic layer 15. In such a case as well, the third magnetic layer 13 also is provided between the first magnetic layer 11 and the first nonmagnetic layer 11N. The fourth magnetic layer 14 is provided between the second magnetic layer 12 and the first nonmagnetic layer 11N.

In the example, the fourth magnetic layer 14 and the second magnetic layer 12 are reference layers. The third magnetic layer 13 and the first magnetic layer 11 are memory layers.

The fifth magnetic layer 15 functions as, for example, a bias layer or a shift adjustment layer. The magnetization of the fifth magnetic layer 15 is antiparallel to (the opposite orientation of) the orientation of the magnetization of the second magnetic layer 12. The fifth magnetic layer 15 may have antiferromagnetic (synthetic anti-ferromagnetic) coupling to the second magnetic layer 12 via the third nonmagnetic layer 13N. Thereby, for example, the shift of the current of the magnetization reversal of the memory layer due to the stray magnetic field from the reference layer can be suppressed. For example, the shift of the current of the magnetization reversal due to the stray magnetic field can be adjusted.

It is favorable for the third nonmagnetic layer 13N to have high heat resistance. For example, thermal mixing between the second magnetic layer 12 and the fifth magnetic layer 15 due to the annealing processes can be suppressed. For example, it is favorable for the third nonmagnetic layer 13N to have the function of controlling the orientation of the crystal when forming the fifth magnetic layer 15.

In the case where the third nonmagnetic layer 13N is excessively thick, the distance between the fifth magnetic layer 15 and the memory layer (in the example, the first magnetic layer 11, etc.) is longer. Therefore, there are cases where the shift adjustment magnetic field applied to the memory layer from the fifth magnetic layer 15 decreases. It is favorable for the thickness of the third nonmagnetic layer 13N to be, for example, 5 nm or less. Thereby, the decrease of the shift adjustment magnetic field recited above is suppressed.

The fifth magnetic layer 15 includes, for example, a ferromagnetic material having an easy magnetization axis in a direction perpendicular to the film face. For example, the distance between the fifth magnetic layer 15 and the memory layer is longer than the distance between the reference layer and the memory layer. For example, it is favorable for the thickness of the fifth magnetic layer 15 to be thicker than the thickness of the reference layer. For example, the saturation magnetization of the fifth magnetic layer 15 is higher than the saturation magnetization of the reference layer. Thereby, the stray magnetic field that is applied to the memory layer can be adjusted effectively by positioning the fifth magnetic layer 15 to have a distance to the memory layer that is longer than that of the reference layer.

For example, the thickness of the reference layer is taken as tr; and the saturation magnetization of the reference layer is taken as Msr. The thickness of the fifth magnetic layer 15 is taken as t5; and the saturation magnetization of the fifth magnetic layer 15 is taken as Ms5. In such a case, for example, it is favorable for (Msr×tr) to be smaller than (Ms5×t5). The thickness of the second magnetic layer 12 is taken as t2; and the saturation magnetization of the second magnetic layer 12 is taken as Ms2. The thickness of the fourth magnetic layer 14 is taken as t4; and the saturation magnetization of the fourth magnetic layer 14 is taken as Ms4. In the example, the thickness (tr) of the reference layer is the sum of the thickness (t4) of the fourth magnetic layer 14 and the thickness (t2) of the second magnetic layer 12. The magnetization amount (Msr×tr) of the reference layer is, for example, (Ms2×t2+Ms4×t4).

The fifth magnetic layer 15 may be provided in combination with any reference layer. In such a case, for example, the reference layer is positioned between the fifth magnetic layer 15 and the memory layer. The third nonmagnetic layer 13N may be provided between the fifth magnetic layer 15 and the reference layer.

Figure 15:
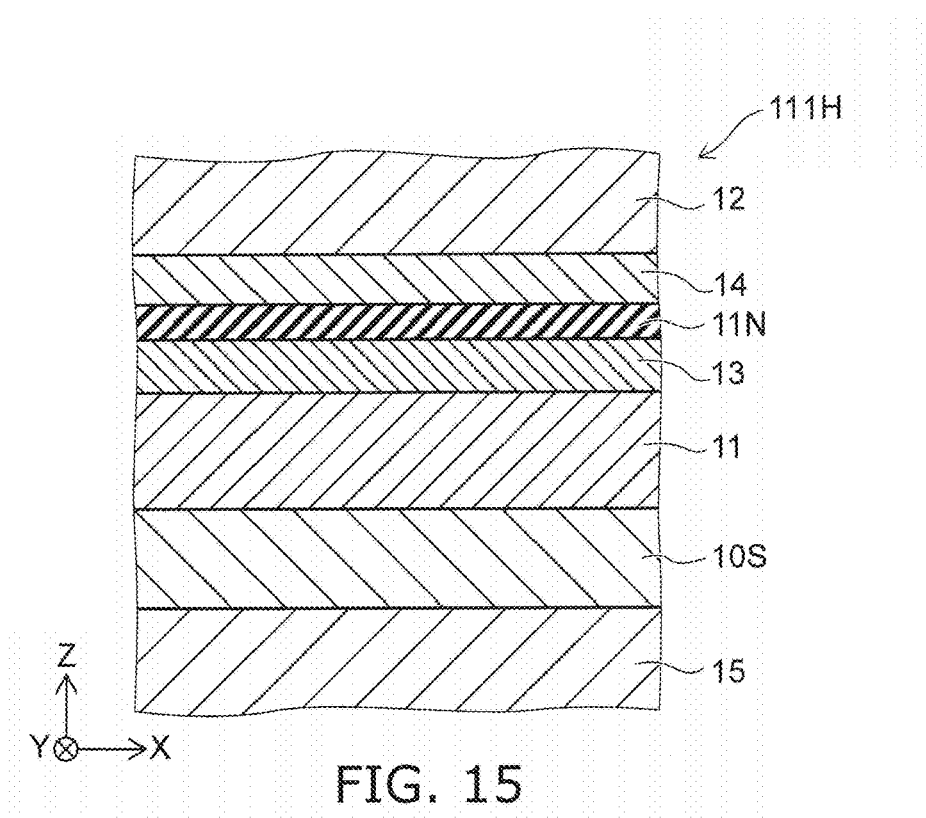
FIG. 15 is a schematic cross-sectional view showing another magnetoresistive element according to the first embodiment.

FIG. 15 is a schematic cross-sectional view showing another magnetoresistive element according to the first embodiment.

As shown in FIG. 15, the magnetoresistive element 111H according to the embodiment includes the third magnetic layer 13, the fourth magnetic layer 14, and the fifth magnetic layer 15.

The first magnetic layer 11 is provided between the fifth magnetic layer 15 and the second magnetic layer 12. In the example, the base layer 10S is provided between the fifth magnetic layer 15 and the first magnetic layer 11. In the example as well, the first nonmagnetic layer 11N is provided between the first magnetic layer 11 and the second magnetic layer 12. The third magnetic layer 13 is provided between the first magnetic layer 11 and the first nonmagnetic layer 11N. The fourth magnetic layer 14 is provided between the second magnetic layer 12 and the first nonmagnetic layer 11N. In the example, the first magnetic layer 11 is used as, for example, a reference layer. The second magnetic layer 12 is used as a memory layer.

Figure 16:
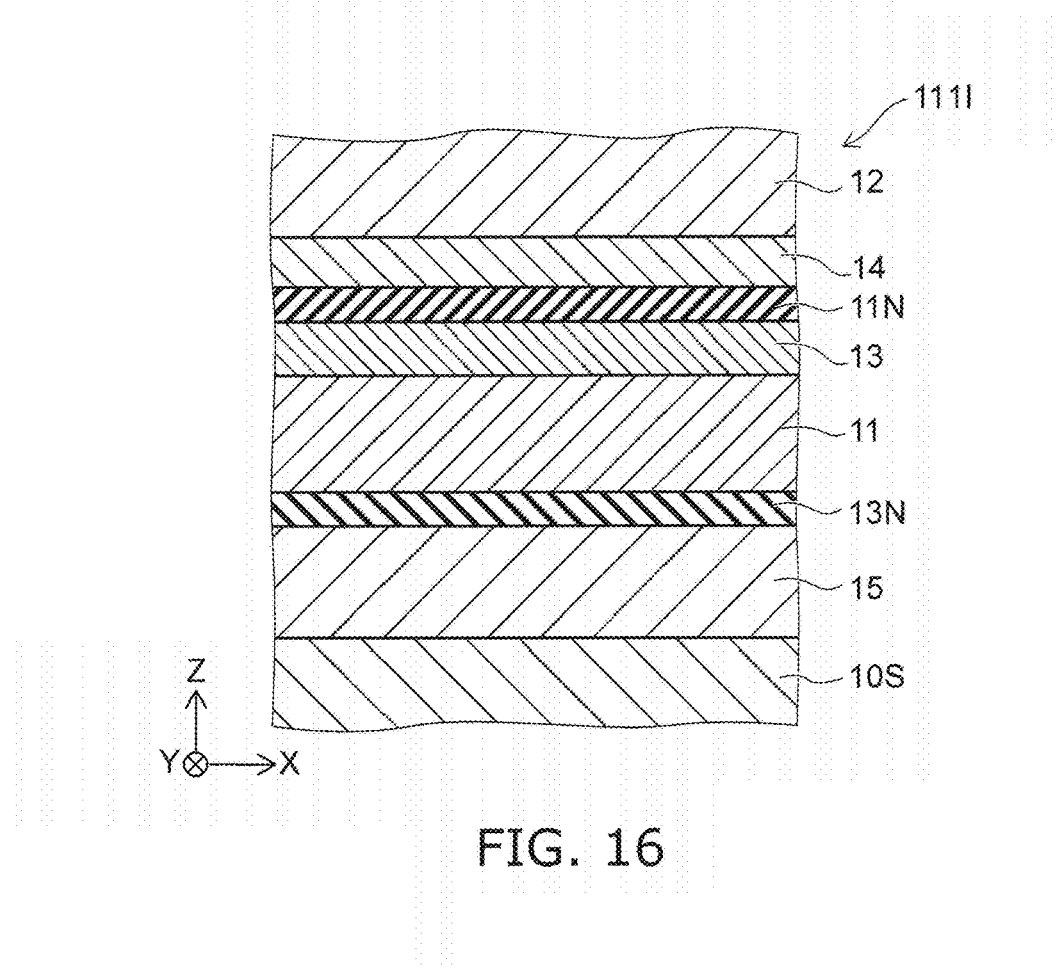
FIG. 16 is a schematic cross-sectional view showing another magnetoresistive element according to the first embodiment.

FIG. 16 is a schematic cross-sectional view showing another magnetoresistive element according to the first embodiment.

As shown in FIG. 16, the magnetoresistive element 111I according to the embodiment includes the third magnetic layer 13, the fourth magnetic layer 14, the fifth magnetic layer 15, and the third nonmagnetic layer 13N.

The fifth magnetic layer 15 is provided between the base layer 10S and the second magnetic layer 12. The first magnetic layer 11 is provided between the fifth magnetic layer 15 and the second magnetic layer 12. The third nonmagnetic layer 13N is provided between the fifth magnetic layer 15 and the first magnetic layer 11. In the example as well, the first nonmagnetic layer 11N is provided between the first magnetic layer 11 and the second magnetic layer 12. The third magnetic layer 13 is provided between the first magnetic layer 11 and the first nonmagnetic layer 11N. The fourth magnetic layer 14 is provided between the second magnetic layer 12 and the first nonmagnetic layer 11N. In the example, the first magnetic layer 11 is used as, for example, a reference layer. The second magnetic layer 12 is used as a memory layer.

In the magnetoresistive elements 111G to 111I in which the fifth magnetic layer 15 is provided, for example, the strength of the stray magnetic field applied to the memory layer from the fifth magnetic layer 15 (the shift adjustment layer) may be set to be substantially the same as the strength of the stray magnetic field applied to the memory layer from the reference layer. For example, the total magnetization amount of the shift adjustment layer is smaller than the total magnetization amount of the reference layer in the case where the distance between the memory layer and the shift adjustment layer is shorter than the distance between the memory layer and the reference layer. On the other hand, in the case where the distance between the memory layer and the shift adjustment layer is longer than the distance between the memory layer and the reference layer, the total magnetization amount of the shift adjustment layer is larger than the total magnetization amount of the reference layer. Thereby, an appropriate shift adjustment is obtained.

In the magnetoresistive elements 111 and 111A to 111I recited above as well, the oxide included in the first nonmagnetic layer 11N includes the inverse-spinel structure. Thereby, a high magnetoresistance ratio MR is obtained. Further, a low resistance area product RA is obtained. High reliability is obtained.

In the magnetoresistive elements (e.g., the magnetoresistive elements 111 and 111A to 111I) according to the embodiment, the orientation of the crystal is controlled for the first magnetic layer 11 and the second magnetic layer 12.

Thereby, for example, it is possible to set the easy magnetization directions of these magnetic layers to be perpendicular to the film face.

The state of being perpendicular to the film face corresponds to the state of being aligned with the Z-axis direction. The state of being parallel to the film face corresponds to the state of being aligned with one direction in the X-Y plane.

For example, the magnetoresistive element according to the embodiment is an in-plane magnetization element (an in-plane magnetization MTJ element) or a perpendicular magnetization element (a perpendicular magnetization MTJ element). In the in-plane magnetization element, for example, the magnetization direction of the first magnetic layer 11 and the magnetization direction of the second magnetic layer 12 are aligned with the film face. In the perpendicular magnetization element, for example, the magnetization of the first magnetic layer 11 and the magnetization of the second magnetic layer 12 are aligned with a direction perpendicular to the film face.

In a ferromagnet having a macro size, the internal energy is lowest when the spontaneous magnetization is oriented in its easy magnetization direction in the state of no external magnetic field. In the ferromagnet having the macro size, the internal energy is largest when the spontaneous magnetization is oriented in its hard magnetization direction in the state in which there is no external magnetic field.

In a first example of the magnetoresistive elements 111 and 111A to 111F recited above, the first nonmagnetic layer 11N may not be an epitaxial layer in which the crystal orientation in the in-plane direction is uniform. For example, the first nonmagnetic layer 11N may include an epitaxially grown monocrystal. Or, the first nonmagnetic layer 11N may have a polycrystalline structure having the c-axis orientation. For example, the wave number selectivity of the tunneling electrons can be improved. A high magnetoresistance ratio MR can be obtained.

In a second example of the magnetoresistive elements 111 and 111A to 111F recited above, it is favorable for the first nonmagnetic layer 11N to be epitaxially grown. Thereby, the wave number selectivity of the tunneling electrons can be improved. A high magnetoresistance ratio MR is obtained.

In a third example of the magnetoresistive elements 111 and 111E recited above, it is favorable for the first nonmagnetic layer 11N to be epitaxially grown. Thereby, the wave number selectivity of the tunneling electrons can be improved. A high magnetoresistance ratio MR is obtained.

In the embodiment, the oxide included in the first nonmagnetic layer 11N may include In and oxygen. In such a case as well, the oxide includes the inverse-spinel structure. In the embodiment, the oxide that is included in the first nonmagnetic layer 11N may include Mg, Ga, In, and oxygen. In such a case as well, the oxide includes the inverse-spinel structure.

For example, at least one of the first magnetic layer 11 or the second magnetic layer 12 includes at least one selected from the group consisting of Co and Fe. For example, at least one of the first magnetic layer 11 or the second magnetic layer 12 includes a first element and a second element. The first element is selected from the group consisting of Mn, Al, Ge, and Ga. The second element is selected from the group consisting of Mn, Al, Ge, and Ga and is different from the first element recited above.

At least one of the third magnetic layer 13 or the fourth magnetic layer 14 includes, for example, at least one selected from the group consisting of Co and Fe.

Examples of the materials, thicknesses, etc., of the layers included in the magnetoresistive element according to the embodiment will now be described.

The base layer 10S is, for example, a foundation layer. For example, the crystallinity of the other layers (for example, the first magnetic layer 11, etc.) is controlled by the base layer 10S. The crystallinity includes, for example, the orientation of the crystal, the grain size of the crystal, etc. The base layer 10S is conductive or insulative. The base layer 10S includes a conductive material in the case where a current is caused to flow in the base layer 10S.

In a first example of the base layer 10S, the base layer 10S has a NaCl structure having the (001) orientation. The base layer 10S includes a nitride. The nitride includes at least one selected from the group consisting of Ti, Zr, Nb, V, Hf, Ta, Mo, W, B, Al, and Ce.

In a second example of the base layer 10S, the base layer 10S includes a perovskite oxide layer. The perovskite oxide layer includes a perovskite oxide having the (002) orientation of $ABO_3$. The site "A" includes at least one element selected from the group consisting of Sr, Ce, Dy, La, K, Ca, Na, Pb, and Ba. The site "B" includes at least one element selected from the group consisting of Ti, V, Cr, Mn, Fe, Co, Ni, Ga, Nb, Mo, Ru, Ir, Ta, Ce, and Pb.

In a third example of the base layer 10S, the base layer 10S includes a layer of an oxide. The layer of the oxide has a NaCl structure having the (001) orientation. The layer of the oxide includes at least one element selected from the group consisting of Mg, Al, and Ce.

In a fourth example of the base layer 10S, the base layer 10S includes a layer including at least one selected from the group consisting of Al, Cr, Ga, Fe, Co, Ni, Rh, Pd, Ag, Ir, Pt, Au, Mo, and W. The layer has a tetragonal crystal structure having the (001) orientation. Or, the layer has a cubic crystal structure having the (001) orientation.

In a fifth example of the base layer 10S, the base layer 10S has a stacked structure including any of the multiple layers of the first to fourth examples recited above.

For example, the crystallinities of the other layers can be controlled by the base layer 10S of the first to fifth examples such as that recited above. Good characteristics are obtained.

The first magnetic layer 11 has, for example, perpendicular magnetization. For example, a saturation magnetization Ms of the material (the magnetic material) of the first magnetic layer 11 is small. The material of the first magnetic layer 11 has, for example, a high magnetic anisotropy energy Ku. The material of the first magnetic layer 11 has, for example, a low Gilbert damping constant. For example, a high thermal stability is obtained. For example, the magnetization reversal is performed using a low current. For example, a thermal stability index $\Delta$ is maintained by the high magnetic anisotropy energy Ku.

In the case where the third magnetic layer 13 is not used, it is favorable for the material of the first magnetic layer 11 to have a high polarization.

In a first example of the first magnetic layer 11, the first magnetic layer 11 includes a magnetic layer including at least one selected from the group consisting of Co and Fe. The first magnetic layer 11 includes, for example, at least one selected from the group consisting of Co, Fe, CoFe, and CoFeB.

In a second example of the first magnetic layer 11, the first magnetic layer 11 includes a magnetic layer including a Co-based Heusler alloy. The Co-based Heusler alloy is notated as $Co_2YZ$. The first magnetic layer 11 includes at least one selected from the group consisting of $Co_2FeAl$, $Co_2MnSi$, $Co_2MnGe$, $Co_2Mn(Si, Ge)$, and $Co_2Mn(Ga, Ge)$.

In the first and second examples recited above, the materials and the thicknesses are selected appropriately. Thereby, a perpendicular magnetic anisotropy is obtained in the first magnetic layer 11. For example, the interface-perpendicular magnetic anisotropy is induced markedly by a certain thickness. The characteristics as a perpendicular magnetization film are obtained.

In a third example of the first magnetic layer 11, the magnetic layer that is included in the first magnetic layer 11 includes Mn and a first element. The first element includes at least one selected from the group consisting of Al, Ge, and Ga. The first magnetic layer 11 includes at least one selected from the group consisting of MnGa, MnAl, MnGe, and MnAlGe.

In a fourth example of the first magnetic layer 11, the first magnetic layer 11 includes Mn, Ga, and a first element. The first element includes at least one selected from the group consisting of Al, Ge, Ir, Cr, Co, Pt, Ru, Pd, Rh, Ni, Fe, Re, Au, Cu, B, C, P, Gd, Tb, and Dy. The first magnetic layer 11 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In the third and fourth examples of the first magnetic layer 11 recited above, for example, the first magnetic layer 11 is grown so that the c-axis is perpendicular to the film face. For example, the first magnetic layer 11 is grown to have the (001) orientation. Thereby, for example, a perpendicular magnetic anisotropy is obtained. For example, the base layer 10S is selected appropriately. Thereby, the crystal orientation growth of the first magnetic layer 11 can be controlled.

In a fifth example of the first magnetic layer 11, the first magnetic layer 11 includes an alloy. The alloy includes a first element and a second element. The first element includes, for example, at least one selected from the group consisting of Fe, Co, and Ni. The second element includes at least one selected from the group consisting of Ru, Rh, Pd, Ag, Ir, Pt, and Au. Or, the first magnetic layer 11 may include a stacked body. The stacked body includes, for example, at least one selected from the group consisting of a Co/Pt artificial lattice, a Co/Pd artificial lattice, a Co/Ru artificial lattice, a Co/Ir artificial lattice, and a Co/Au artificial lattice. In these artificial lattices, the addition of elements and the ratios of the thicknesses of the magnetic layers and the nonmagnetic layers are adjusted. Thereby, for example, the perpendicular magnetic anisotropy and the saturation magnetization are adjusted. The alloy recited above may include, for example, at least one selected from the group consisting of FeRh, FePt, FePd, CoPt, and CoPd. The alloy is, for example, a ferromagnetic alloy.

In a sixth example of the first magnetic layer 11, the first magnetic layer 11 includes an oxide. The oxide includes at least one selected from the group consisting of Mn, Co, Ni, Cu, Zn, and Fe. The first magnetic layer 11 includes, for example, at least one selected from the group consisting of $Fe_3O_4$, $MnFe_2O_4$, $CoFe_2O_4$, $NiFe_2O_4$, $CuFe_2O_4$, and $ZnFe_2O_4$. The first magnetic layer 11 includes, for example, a mixed crystal including at least two selected from the group recited above. The group of the materials recited above is, for example, a ferrite having a spinel crystal structure. In the case where the group of the materials recited above is included in the first magnetic layer 11, the first magnetic layer 11 has the same crystal symmetry as the first nonmagnetic layer 11N. Therefore, good matching properties are obtained. For example, an interface that has high crystal quality and high compatibility is obtained. For example, an interface that has substantially no dislocations is obtained. For example, magnetite ($Fe_3O_4$) is a metallic oxide and has half-metallic properties. The Gilbert damping constant of magnetite ($Fe_3O_4$) is low. Magnetite ($Fe_3O_4$) is applied particularly favorably to the first magnetic layer 11.

It is favorable for the thickness of the first magnetic layer 11 to be thin. The thickness (the length along the Z-axis direction) of the first magnetic layer 11 is, for example, not less than 1 nm and not more than 5 nm. Thereby, for example, magnetization reversal is obtained using a low current. For example, in a crystalline material in which a high thermal stability index Δ is obtained due to the magneto-crystalline anisotropy, there are cases where the anisotropy decreases if the thickness is thin. In the case where such a crystalline material is used, it is favorable for the thickness of the first magnetic layer 11 to be 10 nm or less.

Examples of the third magnetic layer 13 and the fourth magnetic layer 14 will now be described. Hereinbelow, these magnetic layers are called the "intermediate magnetic layer" for convenience. The "intermediate magnetic layer" refers to at least one of the third magnetic layer 13 or the fourth magnetic layer 14.

The intermediate magnetic layer is, for example, a perpendicular magnetization film. The intermediate magnetic layer has, for example, a high magnetic anisotropy energy Ku. The intermediate magnetic layer has a high polarization. For example, a high thermal stability index Δ is maintained by the high magnetic anisotropy energy Ku. In the case where the intermediate magnetic layer functions as the intermediate magnetic layer on the reference layer side, it is favorable for the saturation magnetization of the intermediate magnetic layer to be low. Thereby, the stray magnetic field into the memory layer can be reduced. On the other hand, in the case where the intermediate magnetic layer functions as the intermediate magnetic layer on the memory layer side, it is favorable for the Gilbert damping constant of the intermediate magnetic layer to be low. Thereby, for example, the magnetization reversal due to the current is easy.

As a first example of the intermediate magnetic layer, the intermediate magnetic layer includes an alloy. The alloy includes at least one selected from the group consisting of Fe and Co. The intermediate magnetic layer may include at least one element selected from the group consisting of Ni, B, C, P, Ta, Ti, Mo, Si, W, Nb, Mn, Al, and Ge. For example, the saturation magnetization of the intermediate magnetic layer can be controlled. For example, the alloy that is included in the intermediate magnetic layer may include a first element and a second element. The first element includes at least one selected from the group consisting of Fe and Co. The second element includes at least one selected from the group consisting of Ni, B, C, P, Ta, Ti, Mo, Si, W, Nb, Mn, Al, and Ge. The intermediate magnetic layer includes, for example, CoFeB. The intermediate magnetic layer may include, for example, at least one selected from the group consisting of CoFeSi, CoFeP, CoFeW, and CoFeNb. These alloys have a spin polarization that is equal to that of CoFeB. The intermediate magnetic layer may include, for example, Heusler alloys. The Heusler alloys include, for example, at least one selected from the group consisting of $Co_2FeSi$, $Co_2MnSi$, $Co_2MnGe$, $Co_2MnAl$, $Co_2FeAl$, $Co_2(Fe, Mn) Si$, and $Co_2(Fe, Mn) Al$. The Heusler alloys have, for example, a spin polarization that is equal to or higher than that of CoFeB. The Heusler alloys are suited to the intermediate magnetic layer.

In a second example of the intermediate magnetic layer, the intermediate magnetic layer includes an oxide. The oxide includes at least one selected from the group consisting of Mn, Co, Ni, Cu, Zn, and Fe. The intermediate magnetic layer includes, for example, at least one selected from the group consisting of $Fe_3O_4$, $MnFe_2O_4$, $CoFe_2O_4$, $NiFe_2O_4$, $CuFe_2O_4$, and $ZnFe_2O_4$. The intermediate magnetic layer may include a mixed crystal including two or more selected from the group of the materials recited above. The group of the materials recited above is, for example, a ferrite having a spinel crystal structure. The ferrite that has the spinel crystal structure has the same crystal symmetry as the first nonmagnetic layer 11N. For example, the ferrite that has the spinel crystal structure has excellent matching properties. For example, high crystal quality is obtained. For example, an interface that has substantially no dislocations is obtained. Magnetite ($Fe_3O_4$) is a metallic oxide and has half-metallic properties. Magnetite ($Fe_3O_4$) has a low Gilbert damping constant. Magnetite ($Fe_3O_4$) is applied particularly favorably to the intermediate magnetic layer.

In a third example of the intermediate magnetic layer, the intermediate magnetic layer includes a MnGa alloy. In the example, the intermediate magnetic layer may further include at least one selected from the group consisting of Al, Ge, Ir, Cr, Co, Pt, Ru, Pd, Rh, Ni, Fe, Re, Au, Cu, B, C, P, Gd, Tb, and Dy. For example, at least one of the saturation magnetization, the perpendicular magnetic anisotropy, the Gilbert damping constant, or the spin polarization is controlled. The intermediate magnetic layer includes, for example, MnGaX. The MnGaX includes Mn, Ga, and a first element. The first element (X) includes at least one selected from the group consisting of Al, Ge, Ir, Cr, Co, Pt, Ru, Pd, Rh, Ni, Fe, Re, Au, Cu, B, C, P, Gd, Tb, and Dy. The intermediate magnetic layer includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In a fourth example of the intermediate magnetic layer, the intermediate magnetic layer includes a MnGe alloy. In the MnGe alloy, for example, in the (001) direction, one state of the spin band is positioned at the Fermi level vicinity. It is considered that the MnGe alloy has half-metallic characteristics for this crystal orientation. For example, the spin polarization of the MnGe alloy can be improved. By applying the MnGe alloy, a high magnetoresistance ratio MR is obtained.

In a fifth example of the intermediate magnetic layer, the intermediate magnetic layer includes an alloy. The alloy includes a first element, a second element, and a third element. The first element includes at least one selected from the group consisting of Mn, Fe, Co, and Ni. The second element includes at least one selected from the group consisting of Zn, Al, Ga, In, Si, Ge, Sn, As, Sb, and Bi. The third element includes at least one selected from the group consisting of Zn, Al, Ga, In, Si, Ge, Sn, As, Sb, and Bi. The third element is different from the second element. The intermediate magnetic layer includes, for example, at least one selected from the group consisting of MnAlGe and MnZnSb.

In a sixth example of the intermediate magnetic layer, the intermediate layer includes a MnAl alloy. The MnAl alloy includes a light element. The Gilbert damping constant of the MnAl alloy is small. For example, the energy that is necessary for the magnetization reversal is low. For example, the current density necessary for the spin-polarized electrons to reverse the magnetization can be reduced drastically. Similarly to the MnGe alloy, the MnAl alloy has half-metallic characteristics in the (001) direction. The MnAl alloy has a high spin polarization. By using the MnAl alloy, for example, a high magnetoresistance ratio MR is obtained.

For the MnGa, the MnGaX, the MnGe, the MnAlGe, the MnZnSb, the MnAl, etc., of the intermediate magnetic layer shown in the third to sixth examples recited above, the characteristics as a magnetization film are obtained in the appropriate composition range. For example, the intermediate magnetic layer is oriented so that the c-axis is perpendicular to the film face. For example, the intermediate magnetic layer is grown to have the (001) orientation. Thereby, a perpendicular magnetic anisotropy is obtained. For example, in the case where the intermediate magnetic layer is formed on the first magnetic layer 11, the first magnetic layer 11 is selected appropriately. For example, in the case where the intermediate magnetic layer is formed on the first nonmagnetic layer 11N, the first nonmagnetic layer 11N is selected appropriately. For example, the crystal orientation growth of the intermediate magnetic layer can be controlled by the layer positioned under the intermediate magnetic layer when forming the intermediate magnetic layer.

Generally, the Gilbert damping constant of the magnetic material has a correlation with the magnitude of the spin-orbit coupling of the magnetic material. For example, the spin-orbit coupling is large for materials including an element having a large atomic number. In the material that includes the element having the large atomic number, generally, the Gilbert damping constant is large. The magnetic material of the example recited above includes a relatively light element. Therefore, the Gilbert damping constant is small. The energy that is necessary for the magnetization reversal is low. For example, the current density necessary for the spin-polarized electrons to reverse the magnetization can be reduced drastically. The magnetic material of the example recited above is applicable particularly effectively to the intermediate magnetic layer on the memory layer side.

For example, the third magnetic layer 13 or the fourth magnetic layer 14 is epitaxially grown from the first nonmagnetic layer 11N. Thereby, a high magnetoresistance ratio MR is obtained. For example, in the intermediate magnetic layer that contacts the first nonmagnetic layer 11N, the lattice length along the X-Y plane may be shifted from the unique lattice constant of the material.

The first nonmagnetic layer 11N functions as, for example, a tunneling barrier layer.

The first nonmagnetic layer 11N is crystalline. The first nonmagnetic layer 11N includes, for example, a monocrystal. The first nonmagnetic layer 11N may include a polycrystal. The first nonmagnetic layer 11N may include an amorphous region. By the first nonmagnetic layer 11N being crystalline, for example, scattering of the electrons in the first nonmagnetic layer 11N is suppressed. For example, the probability of selective tunneling conduction of the electrons while storing the wave number increases. Thereby, a high magnetoresistance ratio MR is obtained easily. Accordingly, from the perspective of obtaining a large magnetoresistance ratio MR, it is more favorable for the tunneling barrier layer to be a monocrystal than a polycrystal (including an alignment film).

In a first example of the first nonmagnetic layer 11N, the first nonmagnetic layer 11N includes an oxide. The oxide includes Mg and Ga. The first nonmagnetic layer 11N includes, for example, $MgGa_2O_4$. The bandgap of $MgGa_2O_4$ is about 4.7 eV. Thereby, a low resistance area product RA is obtained. The lattice constant of $MgGa_2O_4$ is 0.8286 nm. For example, the lattice mismatch between $MgGa_2O_4$ and Fe is about 2.2%. The lattice mismatch between $MgGa_2O_4$ and MnGa is about 6.4%. $MgGa_2O_4$ has good lattice matching with many ferromagnetic materials.

The composition ratios of the elements of "$MgGa_2O_4$" may not be exact. For example, the compositions of Mg, Ga, and O may be adjusted in ranges in which the inverse-spinel structure can be maintained. $MgGa_2O_4$ may not be a perfect cubic crystal. For example, tetragonal distortion of 10% or less may be included.

In the experimental results described in reference to FIG. 2, Fe is used as the first magnetic layer 11 and the second magnetic layer 12. In the case where a $MgGa_2O_4$ layer is used with the Fe layer, it is considered that a band-folding effect arises because the in-plane lattice constants are different. For example, there is a possibility that the effective spin polarization of the A band of Fe may decrease due to the band-folding effect. If the decrease of the effective spin polarization is suppressed, a higher magnetoresistance ratio MR is obtained.

For example, in the case where the magnetic layer that is in directly contact with the $MgGa_2O_4$ is half-metallic, the band-folding effect can be substantially ignored. For example, in the case where the magnetic layer is a half-metallic Heusler alloy, etc., it is considered that a magnetoresistance ratio MR that is even higher than the magnetoresistance ratio MR of the experimental results described in reference to FIG. 2 is obtained.

In the embodiment, for example, it is favorable for the magnetic layers (the first to fourth magnetic layers 11 to 14, etc.) that are in directly contact with the first nonmagnetic layer 11N to include Heusler alloys.

In a second example of the first nonmagnetic layer 11N, the oxide included in the first nonmagnetic layer 11N includes Mg, Ga, and In. The first nonmagnetic layer 11N includes, for example, $Mg(Ga, In)_2O_4$, etc.

The compositions of the elements of "$Mg(Ga, In)_2O_4$" may not be exact. For example, the compositions of Mg, Ga, In, and O may be adjusted in ranges in which the inverse-spinel structure can be maintained.

The spinel inversion degree is high for $MgGa_2O_4$ and $MgIn_2O_4$. For example, it is considered that the inverse-spinel structure is stable for $MgIn_2O_4$.

For example, the first nonmagnetic layer 11N may include $MgGa_2O_4$ (the main material) and In. In has a low melting point and a large ionic radius. By using such In, the spinel inversion degree can be increased.

The bandgap of $MgIn_2O_4$ is smaller than the bandgap of $MgGa_2O_4$. For example, the first nonmagnetic layer 11N may include $MgGa_2O_4$ (the main material) and In. For example, a small bandgap is obtained. It is favorable for the oxide of the first nonmagnetic layer 11N to include Mg, Ga, and In. The inverse-spinel structure is more stable; and a small bandgap is obtained.

In a third example of the first nonmagnetic layer 11N, the oxide included in the first nonmagnetic layer 11N includes In. The first nonmagnetic layer 11N includes, for example, at least one selected from the group consisting of $MgIn_2O_4$, $ZnIn_2O_4$, and $(Mg, Zn)In_2O_4$.

The compositions of the elements of "$MgIn_2O_4$" recited above may not be exact. For example, the compositions of Mg, In, and O may be adjusted in ranges in which the inverse-spinel structure can be maintained.

A main group element metal may be further included in the material of the first nonmagnetic layer 11N described in reference to the first to third examples recited above. The main group element is an element that forms a spinel structure. The content of the main group element is, for example, 10 atm % (atomic percent) or less. Thereby, the inverse-spinel structure substantially does not degrade. Such a main group element metal includes, for example, at least one selected from the group consisting of Zn, Cd, Al, Si, Ge, and Sn. For example, a portion of the elements included in the inverse-spinel structure may be replaced with such a main group metal element. For example, the bandgap, the phase stability, and the lattice constant are adjusted.

In a fourth example of the first nonmagnetic layer 11N, the first nonmagnetic layer 11N includes two or more layers of the materials described in reference to the first to third examples recited above. These layers are stacked. The first layer that is included in the stacked structure contacts, for example, the magnetic layer (the first to fourth magnetic layers 11 to 14, etc.). The second layer that is included in the stacked structure does not contact a magnetic layer. For example, the lattice matching of the first layer with the magnetic layer recited above is good. For example, the bandgap of the second layer is low. By such a configuration, for example, a high magnetoresistance ratio MR and a low resistance area product RA are obtained. The first nonmagnetic layer 11N includes, for example, at least one selected from the group consisting of $MgIn_2O_4/MgGa_2O_4$, $Mg(Ga, In)_2O_4/MgGa_2O_4$, $MgGa_2O_4/MgIn_2O_4/MgGa_2O_4$, and $MgGa_2O_4/Mg(Ga, In)_2O_4/MgGa_2O_4$.

The compositions of the elements of "$AB_2O_4$" recited above may not be exact. For example, the compositions of the elements of A, B, and O may be adjusted in ranges in which the inverse-spinel structure can be maintained.

In a fifth example of the first nonmagnetic layer 11N, the first nonmagnetic layer 11N includes a first compound layer and a first layer. The first compound layer is one of MgO or $MgAl_2O_4$. The first layer is stacked with the first compound layer. The first layer includes the materials described in reference to the first to third examples recited above. The first compound layer contacts, for example, a magnetic layer (the first to fourth magnetic layers 11 to 14, etc.). The first layer does not contact a magnetic layer. By such a configuration, for example, a high magnetoresistance ratio MR and a low resistance area product RA are obtained. For the first compound, for example, a high magnetoresistance ratio MR is obtained. A low resistance area product RA is obtained for the first layer including the materials shown in the first to third examples recited above. The first nonmagnetic layer 11N includes, for example, at least one selected from the group consisting of $MgGa_2O_4/MgO$, $MgGa_2O_4/MgAl_2O_4$, $MgO/MgGa_2O_4/MgO$, $MgAl_2O_4/MgGa_2O_4/MgAl_2O_4$, $MgIn_2O_4/MgO$, $MgIn_2O_4/MgAl_2O_4$, $MgO/MgIn_2O_4/MgO$, $MgAl_2O_4/MgIn_2O_4/MgAl_2O_4$, $Mg(Ga, In)_2O_4/MgO$, $Mg(Ga, In)_2O_4/MgAl_2O_4$, $MgO/Mg(Ga, In)_2O_4/MgO$, and $MgAl_2O_4/Mg(Ga, In)_2O_4/MgAl_2O_4$.

The compositions of the elements of "MgO" recited above may not be exact. For example, the compositions of the elements of Mg and O may be adjusted in the ranges in which the rock-salt structure can be maintained. The compositions of the elements of "$AB_2O_4$" recited above may not be exact. For example, the compositions of the elements A, B, and O may be adjusted in ranges in which the inverse-spinel structure can be maintained.

The second magnetic layer 12 has, for example, a perpendicular magnetization. The second magnetic layer 12 has, for example, a high magnetic anisotropy energy Ku. The second magnetic layer 12 has, for example, at least one of a coercivity that is larger than the coercivity of the first magnetic layer 11, an anisotropic magnetic field that is larger than the anisotropic magnetic field of the first magnetic layer 11, or a Gilbert damping constant that is larger than the Gilbert damping constant of the first magnetic layer 11. For example, the thermal stability index Δ can be maintained by the high magnetic anisotropy energy Ku. It is favorable for the saturation magnetization Ms of the second magnetic layer 12 to be small. Thereby, for example, the effects of the stray magnetic field from the reference layer can be reduced.

It is favorable for the polarization of the second magnetic layer 12 to be high. Thereby, for example, a high magnetoresistance ratio MR is obtained.

In a first example of the second magnetic layer 12, the second magnetic layer 12 includes Mn and a first element. The first element includes at least one selected from Al, Ge, and Ga. The second magnetic layer 12 includes at least one selected from the group consisting of MnGa, MnAl, MnGe, and MnAlGe.

In a second example of the second magnetic layer 12, the second magnetic layer 12 includes Mn, Ga, and a first element. The first element includes at least one selected from the group consisting of Al, Ge, Ir, Cr, Co, Pt, Ru, Pd, Rh, Ni, Fe, Re, Au, Cu, B, C, P, Gd, Tb, and Dy. The second magnetic layer 12 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

For example, at least one of the first nonmagnetic layer 11N or the fourth magnetic layer 14 is selected appropriately. Thereby, for example, the crystal orientation growth of the second magnetic layer 12 can be controlled. For example, in the second magnetic layer 12, the c-axis is in a direction perpendicular to the film face. For example, in the second magnetic layer 12, growth in the (001) orientation is obtained. For example, a perpendicular magnetic anisotropy is obtained.

In a third example of the second magnetic layer 12, the second magnetic layer 12 includes an alloy. The crystal of at least a portion of the alloy is oriented in, for example, (111) of a face-centered cubic structure (FCC). Or, the crystal of at least a portion of the alloy is oriented in (0001) of a hexagonal close-packed structure (HCP). The alloy that is included in the second magnetic layer 12 may form, for example, an artificial lattice.

For example, the alloy recited above that has the crystal orientation of (111) of FCC or (0001) of HCP includes, for example, a first element and a second element. The first element includes at least one selected from the group consisting of Fe, Co, Ni, and Cu. The second element includes at least one selected from the group consisting of Pt, Pd, Rh, and Au. The alloy that is included in the second magnetic layer 12 is, for example, a ferromagnetic alloy. The ferromagnetic alloy includes, for example, at least one selected from the group consisting of CoPd, CoPt, NiCo, and NiPt.

The alloy recited above that is included in the second magnetic layer 12 and may form the artificial lattice includes, for example, a first layer and a second layer stacked alternately. The first layer includes, for example, an alloy (a ferromagnetic film) including one element selected from the group consisting of Fe, Co, and Ni. The second layer includes, for example, an alloy (a nonmagnetic film) including one element selected from the group consisting of Cr, Pt, Pd, Jr, Rh, Ru, Os, Re, Au, and Cu. The second magnetic layer 12 includes, for example, at least one selected from the group consisting of a Co/Pt artificial lattice, a Co/Pd artificial lattice, a CoCr/Pt artificial lattice, a Co/Ru artificial lattice, a Co/Ir artificial lattice, a Co/Os artificial lattice, a Co/Au artificial lattice, and a Ni/Cu artificial lattice. In these artificial lattices, at least one of the addition of an element to the ferromagnetic film or the ratio of the thicknesses of the ferromagnetic film and the nonmagnetic film is adjusted. At least one of the perpendicular magnetic anisotropy or the saturation magnetization can be adjusted.

In a fourth example of the second magnetic layer 12, the second magnetic layer 12 includes an alloy. The alloy includes a first element and a second element. The first element includes at least one selected from the group consisting of Fe, Co, and Ni. The first element is, for example, a transition metal. The second element includes, for example, at least one selected from the group consisting of Tb, Dy, and Gd. The second element is, for example, a rare-earth metal. The second magnetic layer 12 includes, for example, at least one selected from the group consisting of TbFe, TbCo, TbFeCo, DyTbFeCo, and GdTbCo. The second magnetic layer 12 may include a stacked body. The stacked body includes multiple layers. Each of the multiple layers includes the alloys recited above. Multiple types of layers may be stacked alternately in the stacked body. The second magnetic layer 12 may include, for example, at least one stacked body selected from the group consisting of TbFe/Co, TbCo/Fe, TbFeCo/CoFe, DyFe/Co, DyCo/Fe, and DyFeCo/CoFe. For example, at least one of the thickness or the composition is adjusted for these alloys. For example, at least one of the perpendicular magnetic anisotropy or the saturation magnetization is adjusted.

In a fifth example of the second magnetic layer 12, the second magnetic layer 12 includes an alloy. The alloy includes a first element and a second element. The first element includes at least one selected from the group consisting of Fe, Co, Ni, and Cu. The second element includes at least one selected from the group consisting of Pt, Pd, Rh, and Au. The second magnetic layer 12 includes, for example, a ferromagnetic alloy. The ferromagnetic alloy includes at least one selected from the group consisting of FeRh, FePt, FePd, CoPt, and CoPd.

Examples of the first intermediate layer 21 and the second intermediate layer 22 will now be described. Hereinbelow, these layers are called the "intermediate layer" for convenience. The "intermediate layer" refers to at least one of the first intermediate layer 21 or the second intermediate layer 22. It is favorable for the intermediate layer to include a nonmagnetic material.

For example, mixing due to the element diffusion between the first magnetic layer 11 and the third magnetic layer 13 is suppressed by the intermediate layer. For example, mixing due to the element diffusion between the second magnetic layer 12 and the fourth magnetic layer 14 is suppressed by the intermediate layer.

For example, the elements that are included in the intermediate layer and the elements that are included in the magnetic layer may not form a solid solution with each other. Or, the elements that are included in the intermediate layer and the elements that are included in the magnetic layer may form a substantially completely intermetallic compound. The mixing is suppressed. For example, a better effect of repelling hetero elements occurs in the intermediate layer. For example, diffusion is suppressed in the intermediate layer. For example, it is favorable for the intermediate layer to have high heating tolerance. It is favorable for the intermediate layer to include a refractory material. For example, it is favorable for the nonmagnetic layer that is included in the intermediate layer to include at least one element selected from the group consisting of Mg, Ba, Ca, Sr, Sc, Y, Ta, W, Nb, Gd, Tb, Dy, Ce, Ho, Yb, Er, B, C, and N. The intermediate layer may include a compound including the elements recited above. For example, the melting point is increased by the compound. For example, the intermediate layer includes at least one selected from the group consisting of a boride including the elements recited above, a carbide including the elements recited above, and a nitride including the elements recited above. The intermediate layer may include a stacked body. The stacked body includes multiple layers including the elements recited above. The stacked body includes multiple layers including the compounds recited above.

In the case where the intermediate layer is provided between two layers and the crystal structures of the two layers are similar to each other, it is favorable for the intermediate layer to be crystalline. For example, it is favorable for the compatibility of the crystal type and the lattice constant of the intermediate layer with the two layers to be good. Thereby, for example, the function of the intermediate layer as a lattice buffer layer increases. On the other hand, in the case where the intermediate layer is provided between two layers and the crystal structures of the two layers are different from each other, it is favorable for the intermediate layer to have an amorphous state. By the intermediate layer having an amorphous state, for example, the desired orientation state is easier to obtain in at least one of the two layers. In the amorphous state of the intermediate layer, for example, there is no long range order (periodic structure) such as that of a crystal. The amorphous state of the intermediate layer may have short range order. The amorphous state of the intermediate layer may include a polycrystal having an average crystal grain of 2 nm or less.

It is favorable for the thickness of the intermediate layer to be, for example, not less than 0.1 nm and not more than 2 nm. For example, in the case where the thickness is 0.1 nm or more, the suppression of the element diffusion in the two layers having the intermediate layer interposed is obtained effectively. In the case where the thickness is 2 nm or less, for example, the magnetic coupling of the two layers having the intermediate layer interposed is maintained.

An example of a method for manufacturing the first nonmagnetic layer 11N will now be described.

For example, a vapor phase epitaxy process is used in at least a portion of the formation of, for example, the oxide included in the first nonmagnetic layer 11N. The vapor phase epitaxy process includes, for example, at least one of sputtering, MBE, or laser ablation. For example, in a first manufacturing method, after forming the alloy layer, the oxide layer is formed by various oxidation processes. The oxidation processes include, for example, the flow of an oxygen gas. The oxidation processes may include, for example, at least one of a plasma oxidation process or a radical oxidation process. A temperature, a processing time, and a power that are suited to the material and thickness of the alloy layer used to form the first nonmagnetic layer 11N are applied. In a second manufacturing method, the formation of a film is performed using an oxide target. For example, the second manufacturing method is suitable in the case where the differences of the oxidizing capabilities and the melting points are large for the element of "A" and the element of "B" included in the spinel-structure oxide (e.g., $AB_2O_4$). In either manufacturing method, at least one of heating film formation or post-heating may be implemented. For example, the first nonmagnetic layer 11N that has a higher crystallinity is obtained.

As described above, the oxide included in the first nonmagnetic layer 11N (e.g., $MgGa_2O_4$) is formed by, for example, sputtering at room temperature. Subsequently, heat treatment is performed at, for example, not less than 300° C. and not more than 600° C. The temperature of the heat treatment may be not less than 400° C. and not more than 500° C. By the heat treatment, high crystallinity and good flatness are obtained. Oxygen may desorb due to the heat treatment. For example, an oxygen gas, etc., may be introduced in the heat treatment or after the heat treatment. Thereby, the desorption of the oxygen can be suppressed.

Second Embodiment

The embodiment relates to a magnetic memory device.

Figure 17:
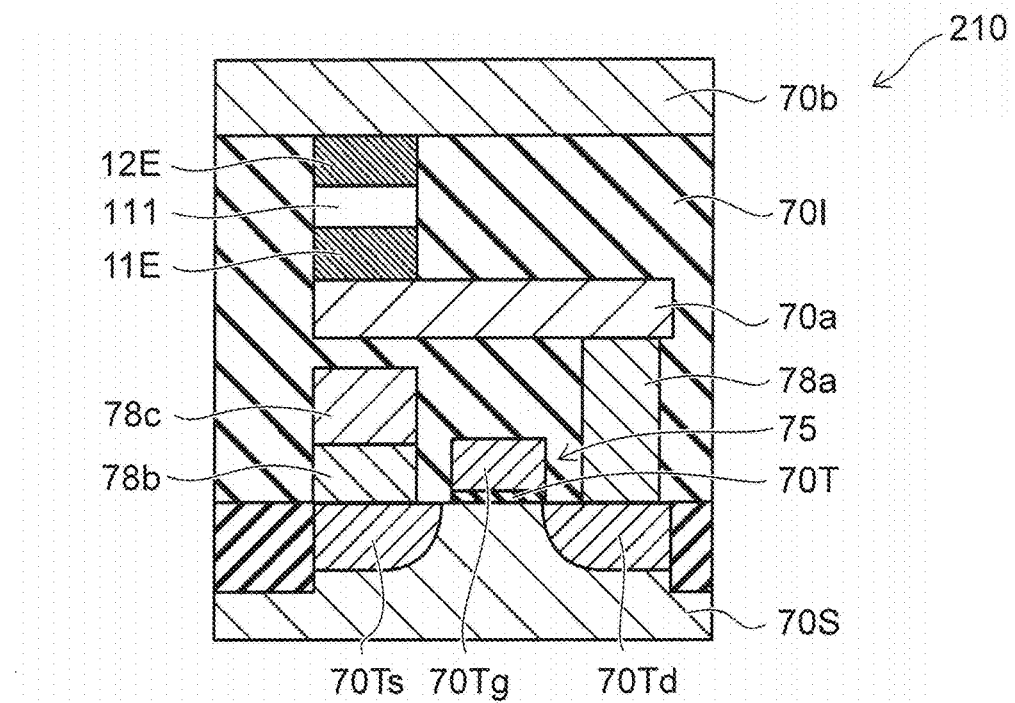
FIG. 17 is a schematic cross-sectional view illustrating a magnetic memory device according to a second embodiment.

FIG. 17 is a schematic cross-sectional view illustrating the magnetic memory device according to the second embodiment.

As shown in FIG. 17, the magnetic memory device 210 according to the embodiment includes, for example, a control element 75 and the magnetoresistive element according to the first embodiment. Any magnetoresistive element according to the first embodiment or any magnetoresistive element of a modification according to the first embodiment may be used. In the example, the magnetoresistive element 111 is used.

The control element 75 is electrically connected to the magnetoresistive element 111. In the example, the control element 75 includes a transistor 70T.

A first conductive layer 11E and a second conductive layer 12E are provided in the example. These conductive layers are, for example, electrodes. The first magnetic layer 11, the second magnetic layer 12, and the first nonmagnetic layer 11N are provided between these conductive layers. The first conductive layer 11E is electrically connected to the first magnetic layer 11. The second conductive layer 12E is electrically connected to the second magnetic layer 12.

A first interconnect 70a and a second interconnect 70b are provided in the example. The first interconnect 70a is electrically connected to the first magnetic layer 11 (in the example, the first conductive layer 11E). The second interconnect 70b is electrically connected to the second magnetic layer 12 (in the example, the second conductive layer 12E). For example, the second interconnect 70b is one bit line. A drain 70Td of the transistor 70T is electrically connected to the first interconnect 70a via a connection portion 78a. A source 70Ts of the transistor 70T is electrically connected to another interconnect 78c via a connection portion 78b. The other interconnect 78c is, for example, another bit line. A gate 70Tg of the transistor 70T corresponds to a word line. In the example, the transistor 70T is provided in a portion of a semiconductor substrate 70S. The transistor 70T functions as, for example, a selection transistor. An inter-layer insulating portion 70I is provided around the transistor 70T, the interconnects, the connection portions, etc.

At least one of the interconnect, the conductive layer, or the connection portion recited above includes, for example, at least one selected from the group consisting of W, Al, AlCu, and Cu.

As described below, multiple magnetoresistive elements 111 (memory cells) are provided. One control element 75 is electrically connected to one of the multiple magnetoresistive elements 111. For example, the one of the multiple magnetoresistive elements 111 is selected by the control element 75.

An example of a method for manufacturing the magnetic memory device according to the embodiment will now be described. The manufacturing method of the example recited below includes a bonding process.

FIG. 18A to FIG. 18E are schematic cross-sectional views illustrating the method for manufacturing the magnetic memory device according to the second embodiment.

Figure 18A:
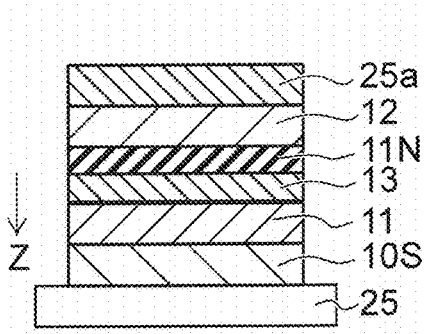
FIG. 18A to FIG. 18E are schematic cross-sectional views illustrating the method for manufacturing the magnetic memory device according to the second embodiment.

A first stacked body SB1 is prepared as shown in FIG. 18A. The first stacked body SB1 includes any magnetoresistive element according to the first embodiment. The magnetoresistive element 111 is provided in the example. The magnetoresistive element 111 is provided on a substrate 25 in the example. The first substrate 25 is a monocrystalline substrate of silicon. A first bonding layer 25a is provided on the magnetoresistive element 111.

For example, the layers that are included in the magnetoresistive element 111 are formed on the substrate 25. The formation includes, for example, implementing at least one of sputtering or MBE (Molecular Beam Epitaxy). The appropriate conditions are applied to the magnetoresistive element 111. For example, crystallinity that reflects the silicon monocrystal crystallinity of the substrate 25 may be provided in the layers included in the magnetoresistive element 111. For example, at least one layer included in the magnetoresistive element 111 is caused to be substantially monocrystalline.

Figure 18B:
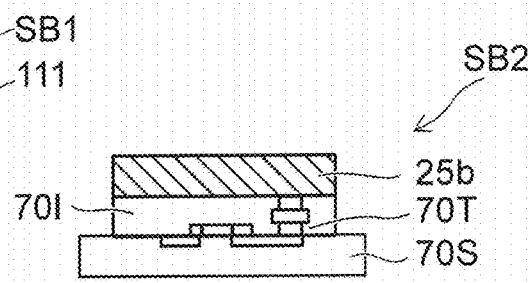

A second stacked body SB2 is prepared as shown in FIG. 18B. The second stacked body SB2 includes, for example, the semiconductor substrate 70S, the transistor 70T, the connection portions (referring to FIG. 17), the inter-layer insulating portion 70I, and a second bonding layer 25b. The second bonding layer 25b is provided on the transistor 70T, the connection portions, and the inter-layer insulating portion 70I.

The first bonding layer 25a and the second bonding layer 25b include metals. The metals include, for example, at least one selected from the group consisting of Al, Au, Cu, Ti, and Ta.

Figure 18C:
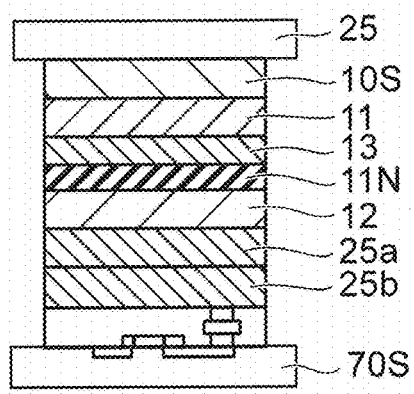

As shown in FIG. 18C, the first bonding layer 25a and the second bonding layer 25b are caused to oppose each other. For example, at least one of heating or the application of pressure is performed. The first bonding layer 25a and the second bonding layer 25b are bonded to each other.

Figure 18D:
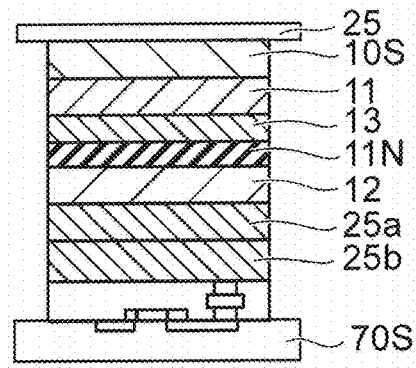

A portion of the substrate 25 is removed as shown in FIG. 18D. For example, BSG (Back Side Grinder) processing is performed. Thereby, the thickness of the substrate 25 is reduced.

Figure 18E:
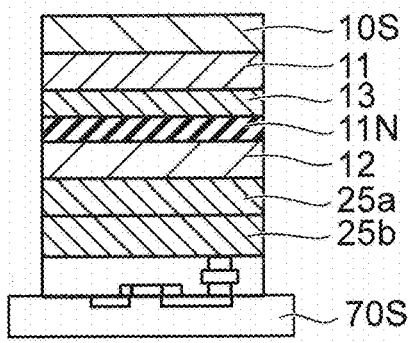

The remaining portion of the substrate 25 is removed as shown in FIG. 18E. For example, CMP (Chemical Mechanical Polishing) processing is performed.

Subsequently, the interconnects, etc., are formed; and the magnetic memory device 210 is made.

In the manufacturing method recited above, the first stacked body SB1 that includes the magnetoresistive element 111 and the second stacked body SB2 that includes the transistor 70T (the control element 75) are prepared separately. These stacked bodies are bonded. Therefore, the appropriate conditions (including the conditions relating to heat) are applied to each of the two stacked bodies. Thereby, good characteristics are obtained for the elements (the magnetoresistive element 111, the transistor 70T, etc.) included in each of the stacked bodies. For example, good crystallinity is obtained for the layers. For example, good amorphousness is obtained for the layers.

Figure 19:
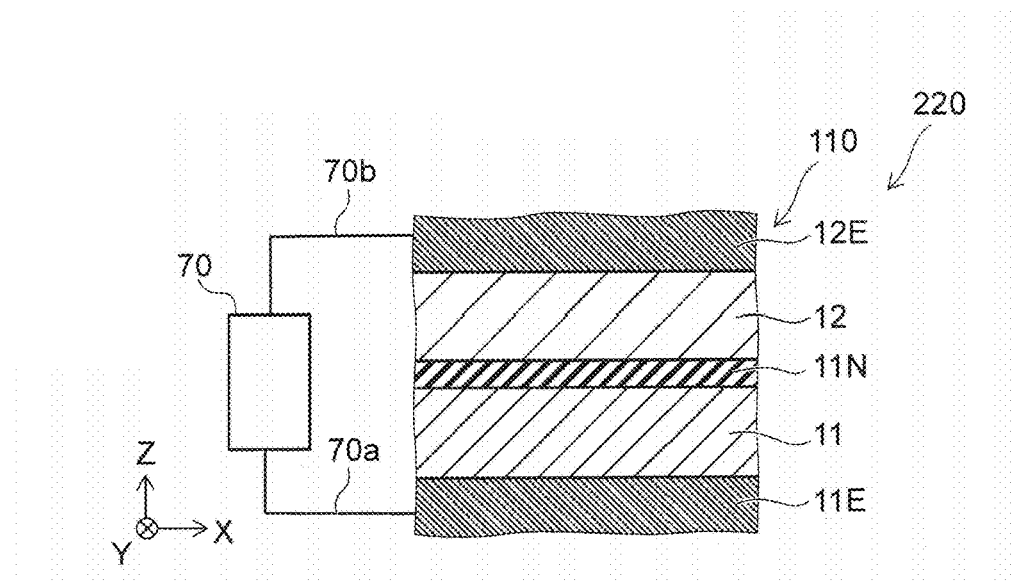
FIG. 19 is a schematic view illustrating the magnetic memory device according to the second embodiment.

FIG. 19 is a schematic view illustrating the magnetic memory device according to the second embodiment.

As shown in FIG. 19, the magnetic memory device 220 according to the embodiment includes, for example, a controller 70 and the magnetoresistive element according to the first embodiment. Any magnetoresistive element according to the first embodiment or any magnetoresistive element of a modification according to the first embodiment may be used. In the example, the magnetoresistive element 110 is used.

The controller 70 is electrically connected to the magnetoresistive element 110. In the example, the first interconnect 70a electrically connects the controller 70 and the first magnetic layer 11 (in the example, the first conductive layer 11E) to each other. The second interconnect 70b electrically connects the controller 70 and the second magnetic layer 12 (in the example, the second conductive layer 12E) to each other. The control element 75 described above may be provided on the path of the electrical connection.

For example, the controller 70 can sense a value (e.g., at least one of a current, a voltage, or a resistance) corresponding to the electrical resistance of the magnetoresistive element 110. For example, the controller 70 reads information stored in the magnetoresistive element 110. The controller 70 implements, for example, a read operation.

For example, the controller 70 may apply external energy (a current, a voltage, an electric field, a magnetic field, etc.) to the magnetoresistive element 110. Multiple states may be formed in the magnetoresistive element 110 by the external energy. The electrical resistance of the magnetoresistive element 110 is different between the multiple states. For example, the multiple states correspond to the information that is stored. For example, a write operation and an erase operation may be implemented.

Figure 20:
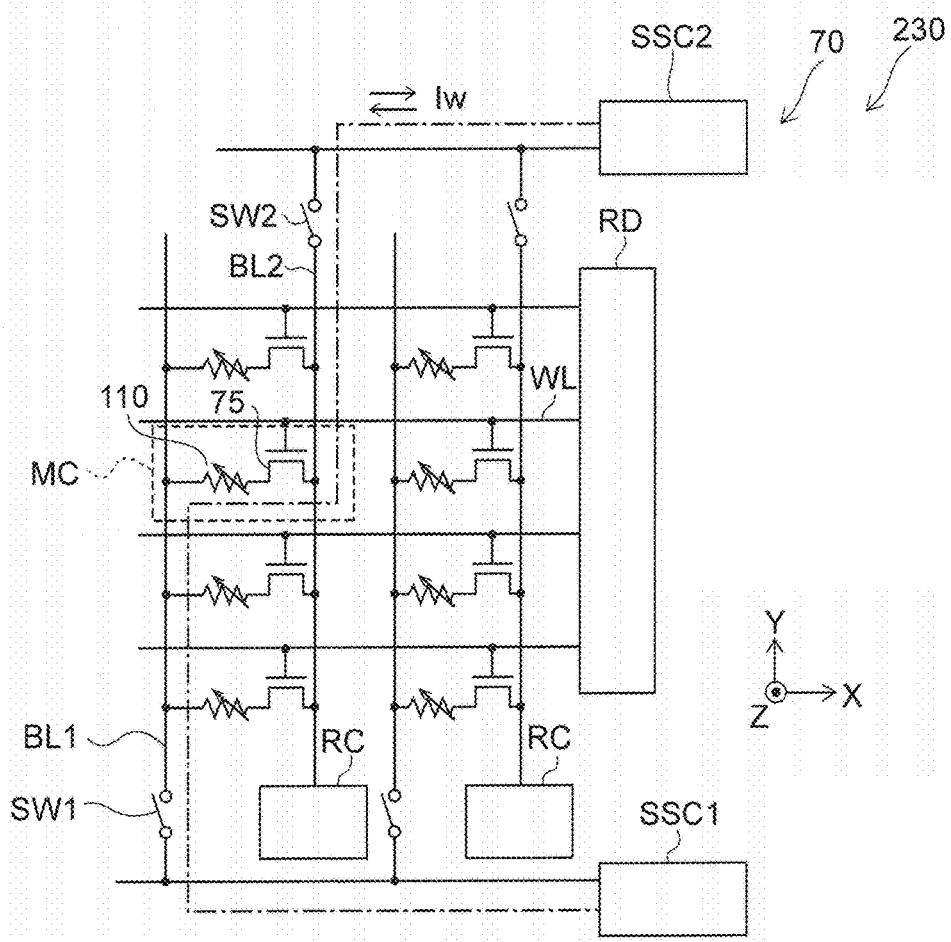
FIG. 20 is a schematic view illustrating a magnetic memory device according to the second embodiment.

FIG. 20 is a schematic view illustrating a magnetic memory device according to the second embodiment.

As shown in FIG. 20, the magnetic memory device 230 according to the embodiment includes multiple memory cells MC and the controller 70.

One of the multiple memory cells MC includes at least one magnetoresistive element and at least one control element 75. The at least one magnetoresistive element is any magnetoresistive element or a modification of a magnetoresistive element according to the first embodiment. The magnetoresistive element 110 is provided in the example. A first terminal of the control element 75 is electrically connected to one end of the magnetoresistive element 110. The control element 75 corresponds to, for example, the transistor 70T. The first terminal corresponds to, for example, the drain 70Td of the transistor 70T.

Multiple bit lines BL1, multiple bit lines BL2, and multiple word lines WL are provided. In the example, the multiple bit lines BL1 and BL2 extend in the Y-axis direction. The multiple bit lines BL1 and BL2 are arranged in the X-axis direction. The multiple word lines WL extend in the X-axis direction. The multiple word lines WL are arranged in the Y-axis direction.

The other end of the magnetoresistive element 110 included in the one of the multiple memory cells MC is electrically connected to one of the multiple bit lines BL1. A second terminal of the control element 75 included in the one of the multiple memory cells MC is electrically connected to one of the multiple bit lines BL2. The second terminal corresponds to, for example, the source 70Ts of the transistor 70T.

A third terminal of the control element 75 included in the one of the multiple memory cells MC is electrically connected to one of the multiple word lines WL. The third terminal of the control element 75 is electrically connected. The third terminal corresponds to, for example, the gate 70Tg of the transistor 70T.

Each of the multiple bit lines BL1 is connected to a first current source/sink circuit SSC1 via a first switch SW1. Each of the multiple bit lines BL2 is connected to a second current source/sink circuit SSC2 via a second switch SW2.

The other end of each of the multiple bit lines BL2 is electrically connected to a read circuit RC. The read circuit RC includes, for example, a read current circuit, a sense amplifier, etc. The read circuit RC may be electrically connected to each of the multiple bit lines BL1.

For example, the first current source/sink circuit SSC1 supplies a write current Iw to the multiple bit lines BL1. Or, for example, the first current source/sink circuit SSC1 receives the write current Iw from the multiple bit lines BL1. For example, the second current source/sink circuit SSC2 supplies the write current Iw to the multiple bit lines BL2. Or, for example, the second current source/sink circuit SSC2 receives the write current Iw from the multiple bit lines BL2.

The multiple word lines WL are electrically connected to a row decoder RD.

For example, at least a portion of the first switch SW1, the second switch SW2, the first current source/sink circuit SSC1, the second current source/sink circuit SSC2, the read circuit RC, and the row decoder RD is included in the controller 70. The controller 70 may include the control element 75.

For example, in the write operation, the first switch SW1, the second switch SW2, and the control element 75 (the transistor 70T) that correspond to the selected cell (one of the multiple memory cells MC) are set to the on-state. For example, one of the first current source/sink circuit SSC1 or the second current source/sink circuit SSC2 functions as a current source. For example, the other of the first current source/sink circuit SSC1 or the second current source/sink circuit SSC2 functions as a current sink. The write current Iw flows in the selected cell in a direction corresponding to the information to be written.

For example, the write current Iw includes a current pulse. The pulse width of the current pulse is, for example, not less than several nanoseconds and not more than several microseconds. The write current Iw flows through the magnetoresistive element 110 of the selected cell. For example, spin injection writing is performed by the write current Iw.

In the read operation, a read current is caused to flow in the magnetoresistive element 110. The magnitude of the read current is smaller than the magnitude of the write current Iw. The sense amplifier of the read circuit RC senses a value (at least one of a current or a voltage) corresponding to the electrical resistance of the magnetoresistive element 110.

The magnetic memory device 230 is, for example, spin injection-writing magnetic memory.

Figure 21:
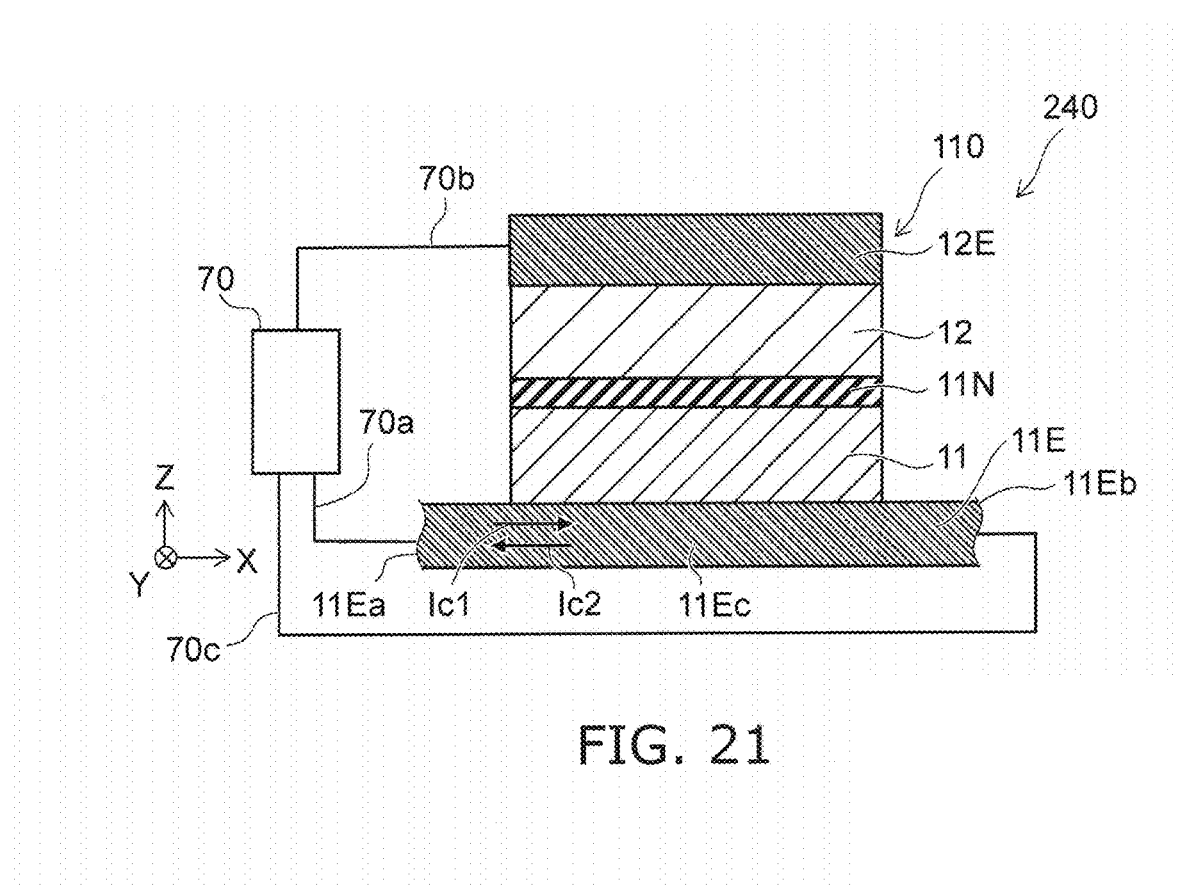
FIG. 21 is a schematic view illustrating another magnetic memory device according to the second embodiment.

FIG. 21 is a schematic view illustrating another magnetic memory device according to the second embodiment.

As shown in FIG. 21, the magnetic memory device 240 according to the embodiment includes the controller 70 and a magnetoresistive element or a modification of a magnetoresistive element according to the first embodiment. The magnetoresistive element 110 is provided in the example. The magnetoresistive element 110 includes the first magnetic layer 11, the second magnetic layer 12, and the first nonmagnetic layer 11N.

The first magnetic layer 11 is provided between the second conductive layer 12E and a portion (a third portion 11Ec described below) of the first conductive layer 11E. The second magnetic layer 12 is provided between the first magnetic layer 11 and the second conductive layer 12E. The first nonmagnetic layer 11N is provided between the first magnetic layer 11 and the second magnetic layer 12. The first conductive layer 11E is electrically connected to the first magnetic layer 11. The second conductive layer 12E is electrically connected to the second magnetic layer 12.

The controller 70 is electrically connected to a first portion 11Ea of the first conductive layer 11E. For example, the connection is performed by the first interconnect 70a.

The controller 70 is electrically connected to a second portion 11Eb of the first conductive layer 11E. For example, the connection is performed by a third interconnect 70c. The third portion 11Ec recited above is provided between the first portion 11Ea and the second portion 11Eb. The controller 70 is electrically connected to the second conductive layer 12E (the second magnetic layer 12).

The controller 70 implements a first operation and a second operation. In the first operation, the controller 70 supplies a first current Ic1 to the first conductive layer 11E. The first current Ic1 flows from the first portion 11Ea toward the second portion 11Eb. In the second operation, the controller 70 supplies a second current Ic2 to the first conductive layer 11E. The second current Ic2 flows from the second portion 11Eb toward the first portion 11Ea.

The electrical resistance between the first magnetic layer 11 and the second magnetic layer 12 after the first operation recited above is different from the electrical resistance between the first magnetic layer 11 and the second magnetic layer 12 after the second operation recited above.

For example, the magnetization of the first magnetic layer 11 after the first operation recited above is in a state corresponding to the orientation of the first current Ic1 recited above. The magnetization of the first magnetic layer 11 after the second operation recited above is in a state corresponding to the orientation of the second current Ic2 recited above. For example, this is based on spin-orbit coupling. For example, this is based on spin-Hall effect.

For example, the angle between the magnetization of the first magnetic layer 11 and the magnetization of the second magnetic layer 12 after the first operation recited above is different from the angle between the magnetization of the first magnetic layer 11 and the magnetization of the second magnetic layer 12 after the second operation recited above.

For example, the magnetoresistive element 110 is selected by a voltage applied between the first conductive layer 11E and the second conductive layer 12E. The magnetization of the first magnetic layer 11 is controlled by the voltage and the orientation of the current recited above.

According to the embodiments, a magnetoresistive element and a magnetic memory device can be provided in which the magnetoresistance ratio can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetoresistive elements or magnetic memory devices such as magnetic layers, intermediate layers, conductive layers, control elements, interconnects, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetoresistive elements and magnetic memory devices practicable by an appropriate design modification by one skilled in the art based on the magnetoresistive elements and the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetoresistive element, comprising:
   a first magnetic layer;
   a second magnetic layer; and
   a first nonmagnetic layer provided between the first magnetic layer and the second magnetic layer, the first nonmagnetic layer including an oxide including an inverse-spinel structure.

2. The element according to claim 1, wherein the oxide includes Mg and Ga.

3. The element according to claim 2, wherein the oxide further includes In.

4. The element according to claim 1, wherein the oxide includes In.

5. The element according to claim 1, wherein
   a length of the first nonmagnetic layer along a first direction is not less than 0.2 nanometers and not more than 4 nanometers, and
   the first direction connects the first magnetic layer and the second magnetic layer.

6. The element according to claim 1, wherein a bandgap of the first nonmagnetic layer is not less than 2 electron volts but less than 7 electron volts.

7. The element according to claim 1, wherein
   a length of the first nonmagnetic layer along a first direction is not less than 1.1 nanometers and not more than 2.8 nanometers, and
   the first direction connects the first magnetic layer and the second magnetic layer.

8. The element according to claim 1, wherein
   the first nonmagnetic layer has a face crossing a first direction,
   the first direction connects the first magnetic layer and the second magnetic layer, and
   the face is aligned with the {100} plane.

9. The element according to claim 1, further comprising a third magnetic layer provided between the first magnetic layer and the first nonmagnetic layer.

10. The element according to claim 9, wherein the third magnetic layer includes at least one selected from the group consisting of Co and Fe.

11. The element according to claim 1, further comprising a fourth magnetic layer provided between the second magnetic layer and the first nonmagnetic layer.

12. The element according to claim 11, wherein the fourth magnetic layer includes at least one selected from the group consisting of Co and Fe.

13. The element according to claim 1, wherein at least one of the first magnetic layer or the second magnetic layer includes at least one selected from the group consisting of Co and Fe.

14. The element according to claim 1, wherein at least one of the first magnetic layer or the second magnetic layer includes a first element and a second element, the first element being selected from the group consisting of Mn, Al, Ge, and Ga, the second element being different from the first element and being selected from the group consisting of Mn, Al, Ge, and Ga.

15. A magnetic memory device, comprising:
the magnetoresistive element according to claim 1; and
a control element electrically connected to the magnetoresistive element.

16. The device according to claim 15, further comprising:
a first interconnect electrically connected to the first magnetic layer; and
a second interconnect electrically connected to the second magnetic layer.

17. A magnetoresistive element, comprising:
a first magnetic layer;
a second magnetic layer; and
a first nonmagnetic layer provided between the first magnetic layer and the second magnetic layer, the first nonmagnetic layer including an oxide including Ga,
the oxide having a plurality of photon energy peaks corresponding to a binding state of the Ga included in the oxide in X-ray absorption near edge structure analysis.

18. A magnetoresistive element, comprising:
a first magnetic layer;
a second magnetic layer; and
a first nonmagnetic layer provided between the first magnetic layer and the second magnetic layer, the first nonmagnetic layer including an oxide,
the oxide including Mg, Ga, and oxygen,
the oxide having a first peak intensity of a first photon energy, a second peak intensity of a second photon energy, and an intermediate intensity of a third photon energy in a photon energy range not less than 10370 electron volts and not more than 10385 electron volts in X-ray absorption near edge structure analysis, the second photon energy being larger than the first photon energy, the third photon energy being between the first photon energy and the second photon energy, the intermediate intensity being lower than the first peak intensity and lower than the second peak intensity.

* * * * *